(12) United States Patent
Meersman et al.

(10) Patent No.: US 12,385,598 B2
(45) Date of Patent: Aug. 12, 2025

(54) ALIGNMENT MECHANISM AND METHODS FOR INSTALLATION OF TILED DISPLAYS

(71) Applicant: BARCO N.V., Kortrijk (BE)

(72) Inventors: Karim Meersman, Kortemark (BE); Tom Declerck, Meulebeke (BE); Bruno Devos, Zulte (BE); Greet Adams, Deerlijk (BE)

(73) Assignee: BARCO N.V., Kortrijk (BE)

( * ) Notice: Subject to any disclaimer, the term of this patent is extended or adjusted under 35 U.S.C. 154(b) by 250 days.

(21) Appl. No.: 17/738,134

(22) Filed: May 6, 2022

(65) Prior Publication Data

US 2023/0288021 A1    Sep. 14, 2023

Related U.S. Application Data

(63) Continuation-in-part of application No. 16/924,575, filed on Jul. 9, 2020, now Pat. No. 11,359,382.

(51) Int. Cl.
*E04B 1/34* (2006.01)
*F16M 13/02* (2006.01)
*H05K 5/30* (2025.01)

(52) U.S. Cl.
CPC .............. *F16M 13/022* (2013.01); *H05K 5/30* (2025.01)

(58) Field of Classification Search
CPC ....................... F16M 13/022; H05K 5/0021
See application file for complete search history.

(56) References Cited

U.S. PATENT DOCUMENTS

| 5,323,552 | A | 6/1994 | Fritz |
| 5,761,839 | A | 6/1998 | Heikkila |
| 6,054,968 | A | 4/2000 | Matteo |

(Continued)

FOREIGN PATENT DOCUMENTS

| IN | 108922421 A | 11/2018 |
| KR | 20070085011 A | 8/2007 |

(Continued)

OTHER PUBLICATIONS

International Search Report and Written Opinion issued in PCT/EP2021/069236, dated Nov. 29, 2021.

(Continued)

*Primary Examiner* — Basil S Katcheves
(74) *Attorney, Agent, or Firm* — HSML P.C.

(57) ABSTRACT

An intermediary support structure that includes a linear or rotational actuator to move the single display tile from a first position in a first plane along a predetermined path to a second position in the first plane. The first position is a loading position of the single display tile in the tiled display and the second position is a position in which the single display tile lies when installed in its operative position in the tiled display. When the single display tile is located in the first position, there is a distance between the loading position and the operative position, the linear or rotational actuator is configured so that the distance becomes smaller as the single display tile is moved along the predetermined path towards the second position. The linear or rotational actuator is accessible and remains accessible until an adjacent display tile is covering an access to the actuator.

23 Claims, 25 Drawing Sheets

(56) References Cited

U.S. PATENT DOCUMENTS

| | | | | |
|---|---|---|---|---|
| 6,288,891 | B1* | 9/2001 | Hasegawa | F16M 11/10 361/679.22 |
| 7,448,584 | B2* | 11/2008 | Chen | F16M 13/02 248/920 |
| 7,663,868 | B1* | 2/2010 | Lam | H05K 5/0204 361/679.06 |
| 7,832,700 | B2* | 11/2010 | Ciungan | F16M 11/2085 248/281.11 |
| 8,042,778 | B2* | 10/2011 | Wu | F16M 13/02 248/289.11 |
| 8,384,616 | B2* | 2/2013 | Elliott | F21V 21/005 345/82 |
| 8,523,129 | B2* | 9/2013 | Stifal | F16M 11/10 248/299.1 |
| 8,561,955 | B2* | 10/2013 | Stemple | F16M 11/10 361/679.01 |
| 8,693,172 | B2* | 4/2014 | Russell | F16M 11/2085 361/679.01 |
| 9,004,430 | B2* | 4/2015 | Conner | H04N 5/655 248/920 |
| D747,724 | S* | 1/2016 | Kulkarni | D14/452 |
| 9,265,346 | B1* | 2/2016 | Forney | A47B 97/001 |
| 9,441,784 | B2* | 9/2016 | Russell | F16M 13/02 |
| 9,837,002 | B2* | 12/2017 | Pyc | F16M 13/02 |
| 10,056,014 | B2* | 8/2018 | Meersman | G09F 9/3026 |
| 10,064,504 | B2 | 9/2018 | Hogrefe | |
| 11,215,313 | B1* | 1/2022 | Beil | F16M 11/2014 |
| 11,359,382 | B2* | 6/2022 | Meersman | E04F 13/0871 |
| 11,959,583 | B2* | 4/2024 | Newville | F16M 11/2007 |
| 2003/0056413 | A1 | 3/2003 | Wiemer et al. | |
| 2004/0135482 | A1* | 7/2004 | Thielemans | H10K 50/87 313/33 |
| 2006/0219856 | A1* | 10/2006 | Oh | G09F 7/205 248/274.1 |
| 2007/0030405 | A1* | 2/2007 | Childrey | F16M 11/2092 348/794 |
| 2009/0310065 | A1 | 12/2009 | Dunn | |
| 2013/0027618 | A1* | 1/2013 | Chen | F16M 11/2092 348/836 |
| 2017/0127539 | A1* | 5/2017 | Drabant | G09F 15/0031 |
| 2018/0359426 | A1 | 12/2018 | Adema et al. | |
| 2020/0318787 | A1* | 10/2020 | Chambers | F16M 11/048 |
| 2020/0326032 | A1* | 10/2020 | Kaufmann | F16M 13/02 |
| 2021/0311684 | A1* | 10/2021 | Nussbaumer | F16M 11/18 |
| 2021/0405700 | A1* | 12/2021 | Betz | A61B 5/0077 |
| 2022/0010562 | A1* | 1/2022 | Meersman | G09F 9/3026 |
| 2023/0245600 | A1* | 8/2023 | Meersman | F16M 11/06 362/97.1 |

FOREIGN PATENT DOCUMENTS

| | | |
|---|---|---|
| WO | 2019034786 A1 | 2/2019 |
| WO | 2020074064 A1 | 4/2020 |

OTHER PUBLICATIONS

Communication issued in European Application No. 21746666.3, dated Jan. 21, 2025.

* cited by examiner

Fig. 7B
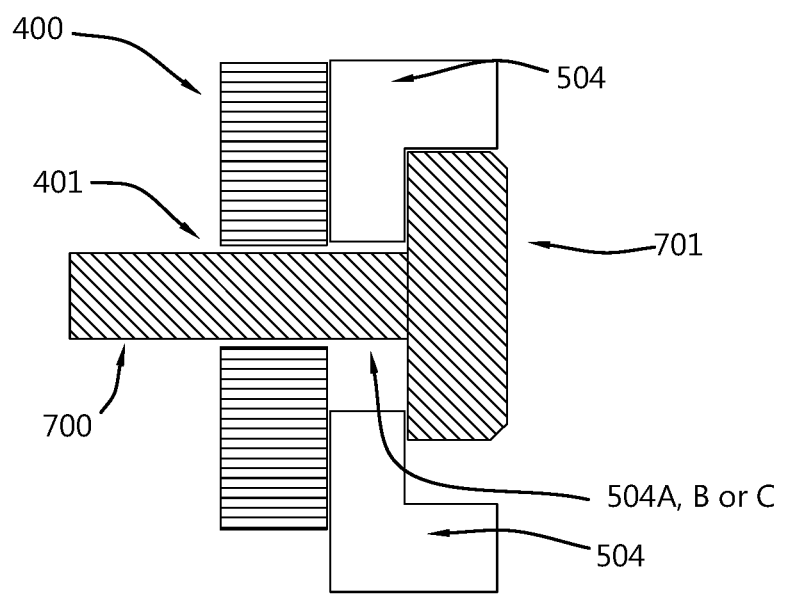
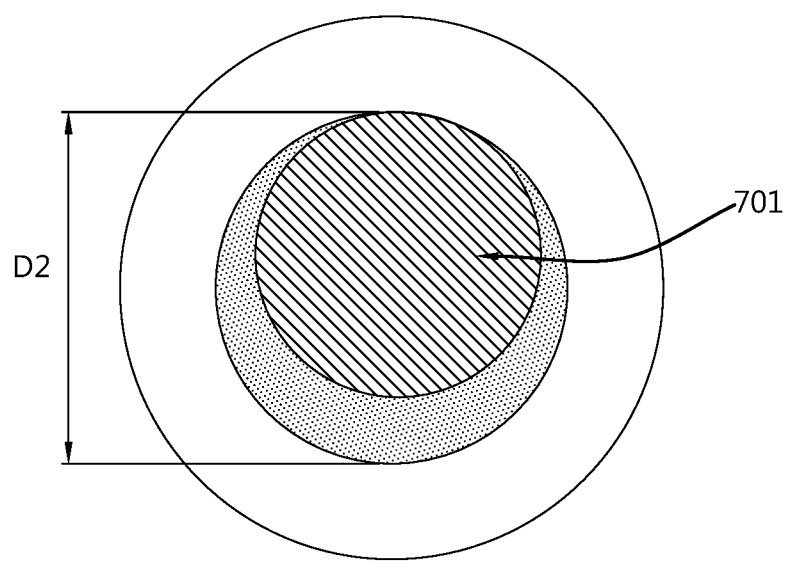

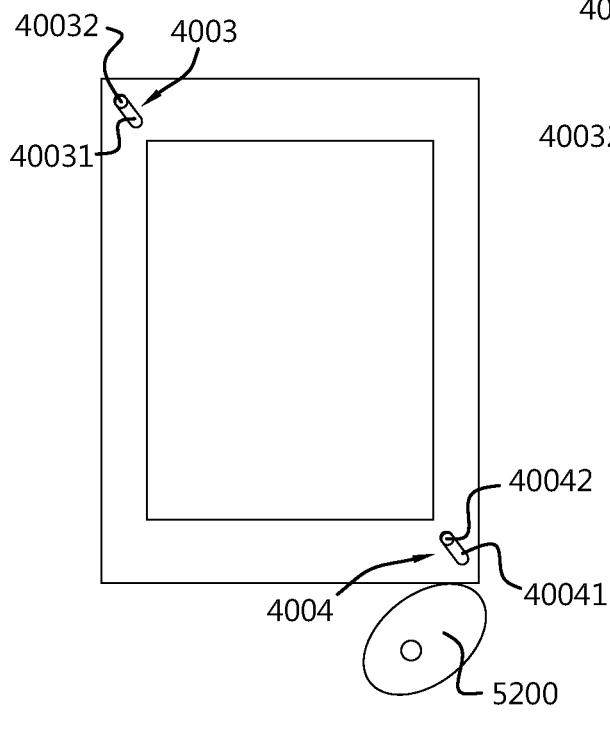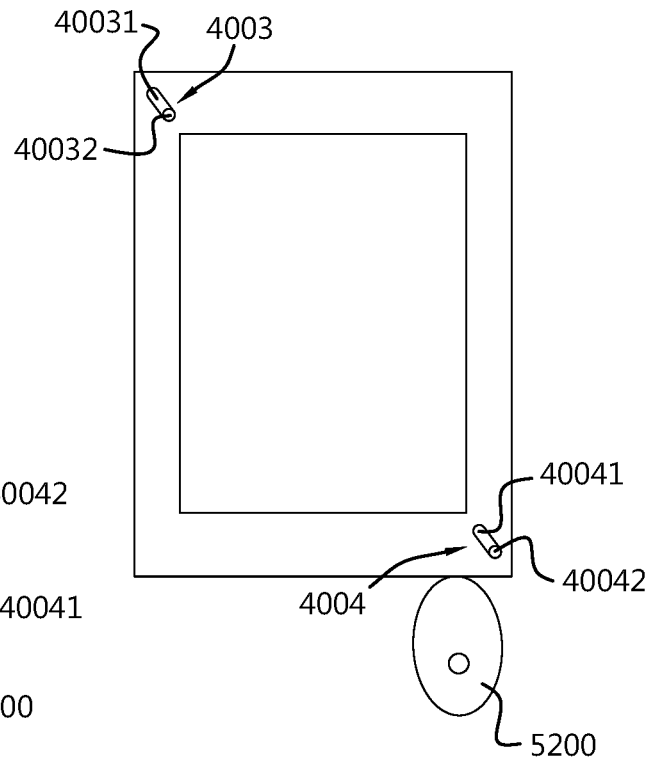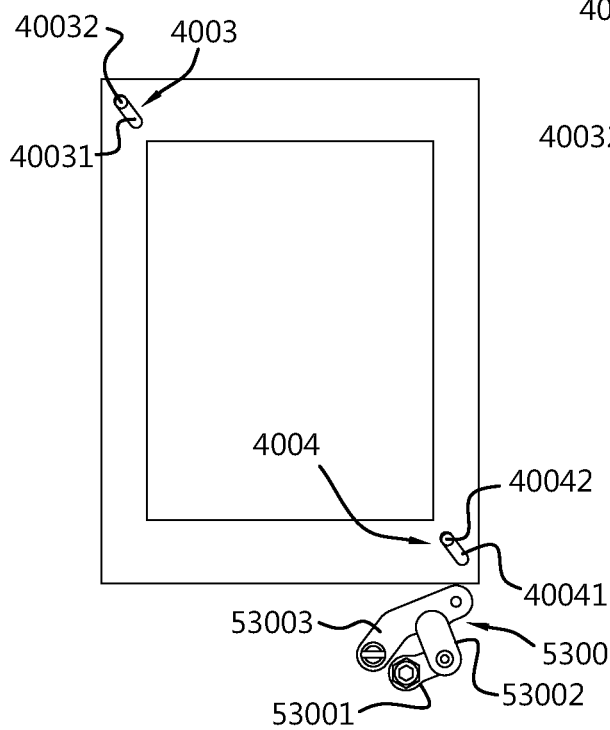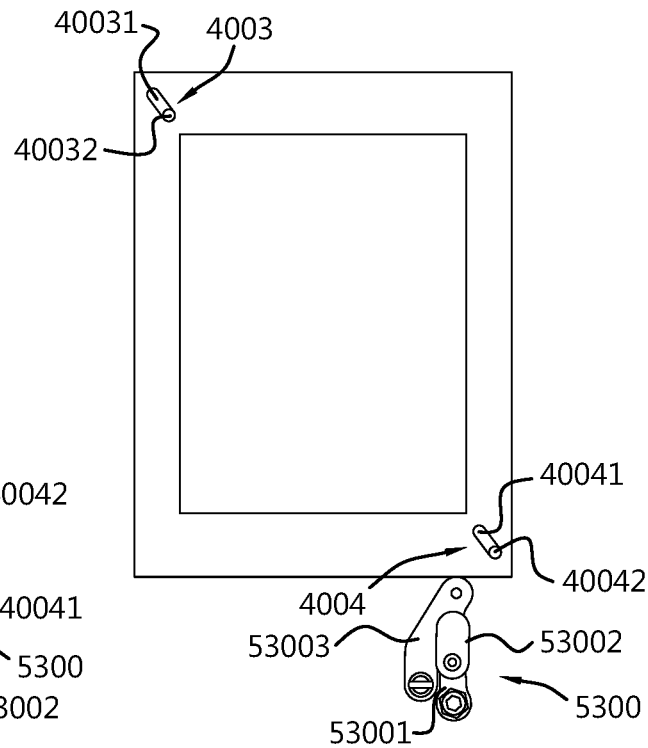

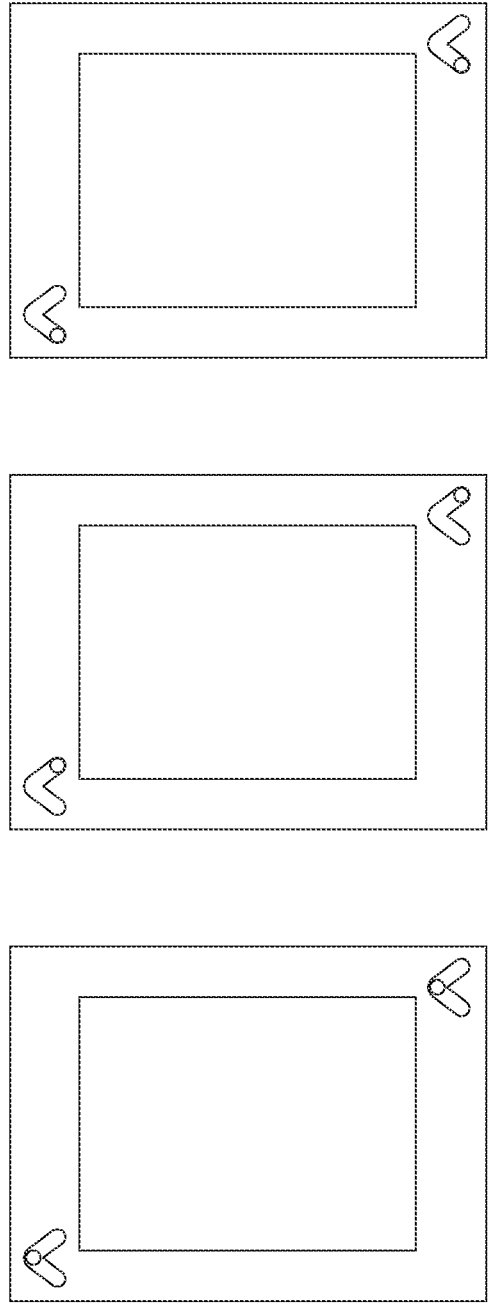

ALIGNMENT MECHANISM AND METHODS FOR INSTALLATION OF TILED DISPLAYS

CROSS-REFERENCE

This application is a continuation-in-part of U.S. application Ser. No. 16/924,575 filed Jul. 9, 2020, which is incorporated by reference in its entirety.

The present invention relates to methods of and devices for and systems for positioning and/or alignment of display tiles in a tiled displays, as well as an alignment mechanism to adjust the relative position of adjacent display tiles as they are assembled to form a tiled display, as well as methods of making or operating such display tiles and tiled display.

BACKGROUND

Solutions to align the display tiles of a tiled display are known from the art.

U.S. Ser. No. 10/056,014 "Positioning and alignment device for tiled displays" describes an alignment mechanism to adjust the relative position of adjacent display tiles as they are assembled to form a tiled display. FIGS. 1a and 1b show a top view and a section view (along line AB of FIG. 1a) of an example of alignment mechanism according to U.S. Pat. No. 10,056,014. The alignment mechanism 1 is fastened to a support structure 12 by means of a compliant fastener 2 that is force fitted into an opening 4 present in the support structure 12 and an opening 3 present in the alignment device. Two adjacent tiles can be aligned by means of e.g. a pin (on the tile) and hole (like 9 and 10 on the alignment device) combination. The compliance of the fastener 2 allows the compensation of tolerances that affects the position of openings (like 4) in the support structure 12 while the distance between two adjacent tiles is determined by the geometry of the alignment device and in particular the position of the holes (like 9 and 10) in which positioning pins on display tiles will be fitted.

The alignment mechanism requires extensive manipulation of the tiles and for very small seams (when the distance between adjacent tiles is less than 1 mm), this can become a problem. Indeed, as the dimensions of light emitting elements decrease, they become more fragile and shocks between adjacent tiles during assembly can be enough to damage them and create visual artefacts during operation of the display (dead pixels, discoloration, etc.) US20180359426 "Fixture for Aligning Tiled Displays" describes a fixture for adjusting the position of a display tile with respect to adjacent display tiles. The fixture includes a frame that supports a vision system. The vision system is configured to image at predefined display corner positions defined by given display dimensions. As illustrated on FIG. 2, the fixture 200 further includes an attachment mechanism configured to attach the frame of the fixture to the display surface 202 of a display tile 201 such that the vision system images positions of the tile and adjacent display corner positions. The fixture can be operated by a technician that will move the tile until its position is nominal (as determined by the vision system). Alternatively, the fixture can be supported by the support structure that supports the display tiles and one or more alignment mechanisms adjust the alignment of the display tile. US20180359426 does not describe where the one or more alignment mechanism can be positioned when the fixture is attached to the front of a display tile nor does it describe how to avoid damaging the LEDs mounted on the display tile (e.g. by scratching the coatings of the LEDs) when the fixture contacts the display tile.

WO2019/034786A1 "Adjustable support structure for display tile" describes a support structure with a built-in tile alignment system wherein collisions between adjacent display tiles are prevented. The support structure comprises several intermediary parts between the load bearing structure (not shown) and the display tile 300. Four elements (only 301, 302 and 303 are shown on FIG. 3a) correct irregularities of, for example, a wall to which the display structure will be fastened. A first intermediary part 304 has a fixed position with respect to, for example, the load bearing wall. A second intermediary mechanism 305 allows displacement of the display tile 300 in the display plane xy, a.o. to create a gap around the display tile 300 and grant access to the fastening means 306, that fasten the display 300 tile to the rest of the structure. The fastening means allow movement of the display tile in the z direction. This facilitates, for instance, access to, for example, one or more handles and/or a release mechanism positioned on the lateral sides or backside of the display tile 300, without requiring interaction with the front or display side 307 of the display tile. Shocks between adjacent display tiles are softened by the mechanism 305 (use of, for example, a gas spring, not shown on FIG. 3a) as well as by corner elements like 308, 309, 310 that can act as bumpers and avoid contact with fragile elements (such as, for example, a glass substrate of a liquid crystal panel or the coating of LEDs) on the display side 307 of the display tile 300.

As illustrated on FIG. 3b, a display tile 300 hangs to fastening means 306 (i.e. no contact with the front surface 307 is required to position the display tile). An operator assembling the tiled display does not have to carry the weight of a display tile while modifying its position in the xy plane. Not having to carry the weight of the tile during assembly means that an operator can concentrate on the precision of the positioning and avoiding shocks to the display surface. The support structure described in WO2019/034786A1 limits the risk of damages to the display side of a display tile and facilitates the assembly of display tile into a tiled display, but it requires mechanical precision for the various structures like 301, 304, 305 and 306.

If there is no access to the back of the tiled display, fastening and unfastening a display tile requires a dedicated mechanism as described in, for instance, WO2019/034786A1.

The art has no solution for using simple and reliable fastening means (like, for example, bolts) that can be accessed from the front of the tiled display, while at the same time allowing to have seams smaller than the fastening means. For instance, using bolts to fasten a display tile to a support structure without access to the back of the support structure, is not possible if the diameter of the bolt is larger than the seam between a tile already fastened to the support structure and an adjacent tile being fastened to the support structure.

What is needed in the art, are methods and apparatuses to enable the realization of high-quality tiled displays with controllable seams while at the same time minimizing the precision required for, for example, machining the support structure and reducing the risk of damages to the display elements (such as, for example, light emitting diodes, surface of liquid crystal display panels, etc.).

Display tiles are typically placed into a structure for a tiled display in a direction perpendicular to the plane of the tiled display. As the distance between these modules is very small and as the display tiles have fragile edges, it often happens that display tiles get damaged during installation of a display tile in the tiled display.

The art has no solution for a simple and reliable installation of display tiles in a tiled display with far less risk of damaging the display tiles.

What is needed in the art, are a simple device and method to enable realization of a simple, reliable and high-quality installation of display tiles in a tiled display with a drastically reduced risk of display tiles getting damaged during the installation process.

SUMMARY OF THE INVENTION

An aspect of the present invention relates to an intermediary support structure with fastening means for fastening to a back side of a display tile further comprising a fastener or a fastening means for fastening the intermediary support structure to a support structure, said support structure supporting multiple display tiles forming a tiled display. The support structure can be a wall or a frame attached to a wall, for example. The intermediary support structure allows displacement of the display tile in the display plane XY, the plane XY being the plane in which the display tiles of the tiled display lie.

Embodiments of the present invention provide an intermediary support structure for supporting a single display tile of a tiled display and comprising a linear or rotational actuator configured to move the single display tile from a first position in a first plane, which first plane is parallel to the XY-plane of the single display tile, along a predetermined path to a second position in the first plane, whereby the first position is a loading position of the single display tile in the tiled display and the second position is a position in which the single display tile lies when installed in its operative position in the tiled display; whereby when the single display tile is located in the first position, there is a distance between the loading position and the operative position; the linear or rotational actuator is configured so that the distance becomes smaller as the single display tile is moved along the predetermined path towards the second position, whereby the linear or rotational actuator is accessible outside a perimeter or footprint of the single display tile and remains accessible in positions along the predetermined path, and remains accessible until an adjacent display tile is covering an access to the linear or rotational actuator.

This intermediary support structure is a simple device and can be installed by a simple method to enable a simple, reliable and high-quality installation of display tiles in a tiled display with a reduced risk of display tiles getting damaged during the installation process. This is achieved by the way the intermediary support structure is moved from a loading position to an operative position.

The predetermined path can be a path at an angle to the X-axis of the XY-plane. Hence, the path can be a diagonal one. The distance can be a distance between the single display tile and one or more adjacent display tiles, whereby the distance is between adjacent lateral edges facing each other of respectively the single display tile and of the one or more adjacent display tiles. These features guide the intermediary support structure into its operative position safely.

The movement along the predetermined path can be generated by the linear or rotational actuator optionally controlled by a linear guide. These devices can be included simply in the intermediary support structure and can work easily and safely.

The loading position is preferably the position which the single display tile has during the initial placement thereof in the tiled display. The loading position provides a safety distance to other display tiles because the first position is the position in which the distance is larger than the nominal seam between the single display tile and one or more adjacent display tiles.

The intermediary support structure can be configured so that the distance becomes equal to the seam between the single display tile and the one or more adjacent display tiles when the single display tile has reached the second position. Reducing the distance between display tiles to the size of the seam places the intermediary support structure in the best aesthetic position.

The single display tile and the intermediary support structure can be a module configured to behave as a single body, whereby the relative position of the single display tile and the intermediary support structure with respect to each other is fixed in any position on the predetermined path. By keeping the intermediary support structure and the single display tile together in a module increases safety and reduces the possibility that the display tile or the intermediary support structure are accidentally dropped.

The linear or rotational actuator can be configured to be able to induce a movement from the first position to the second position. The linear or rotational actuator can be a hand-driven actuator.

This results in low forces applied to the tiled display, whereby the linear or rotational actuator can be a motor-driven actuator where this is advantageous.

The linear or rotational actuator is preferably selected from a rack and pinion system, an over centered cam, an articulated lever, over centered articulated lever, a wedged cam. These are simple mechanically elements.

The intermediary support structure can be configured to lie between the single display tile and the support structure. This provides a compact arrangement.

The intermediary support structure can also have a coupling means or fastening means configured for coupling or fastening the intermediary support structure to a single display tile. This is a safe way of making a module.

The coupling or fastening means can comprise holes that are configured to mate with protrusions such as pins on the single display tile or vice versa. These are simple and reliable mechanical elements.

The intermediary support structure can be configured so that the pins and/or holes of the intermediary support structure and the corresponding holes and pins on the back surface of the single display tile are mated and the single display tile and the intermediary support structure behave like a solid body. This reduces the risk that the intermediary support structure comes free from the tiled display.

The intermediary support structure can be configured to be at least partially or temporarily supported by the support structure. This reduces the risk of the intermediary support structure coming free from the tiled display.

The linear or rotational actuator can be self-guided. This makes a compact arrangement.

The single display tile can be in the second position and the linear or rotational actuator is autolocking to keep the single display tile in its second position. This increases the safety of working with the intermediary support structure, e.g. to reduce the risk that the intermediary support structure moves involuntarily.

The fastening means for fastening the intermediary support structure to the support structure can be distributed along one side of the single display tile or two adjacent sides of the single display tile. A plurality of fastening points increases reliability.

Embodiments of the present invention include a tiled display configured to be fastened to a support structure and including a plurality of intermediary support structures, wherein a plurality of display tiles of the tiled display is fastened to the support structure by means of intermediary support structures and a plurality of fastening means, whereby a single display tile is fastened to an associated intermediary support structure of the plurality of intermediary support structures.

These mechanical elements provide a reliable installation.

The tiled display can have a plurality of fastening means used to fasten the single display tile to the support structure are either on a single side or edge of the single display tile or are distributed along two abutting sides or edges of the single display tile. These mechanical elements also provide a reliable installation.

Embodiments of the present invention provide a method for installing a display tile in a tiled display, comprising the steps of:
supporting a single display tile of the tiled display with an intermediary support structure;
moving, by means of a linear or rotational actuator, the single display tile from a first position in a first plane, which the first plane is parallel to the XY-plane of the single display tile, along a predetermined path to a second position in the first plane, whereby the first position is a loading position of the single display tile in the tiled display and the second position is a position in which the single display tile lies when installed in its operative position in the tiled display; whereby when the single display tile is located in the first position, there is a distance between the loading position and the operative position; whereby the distance becomes smaller as the single display tile is moved along the predetermined path towards the second position, whereby the linear or rotational actuator is accessible outside a perimeter or footprint of the single display tile and remains accessible in positions along the predetermined path, and remains accessible until an adjacent display tile is covering an access to the linear or rotational actuator. This method has the advantage that display tiles can be reliably moved and installed in a tiled display using simple mechanical elements that are reliable in operation.

The following are aspects of some embodiments of the present invention starting with aspect 1 and going up to aspect 23:

Aspect 1. An intermediary support structure for supporting a single display tile of a tiled display and comprising a linear or rotational actuator configured to move the single display tile from a first position in a first plane, which the first plane is parallel to the XY-plane of the single display tile, along a predetermined path to a second position in the first plane, whereby the first position is a loading position of the single display tile in the tiled display and the second position is a position in which the single display tile lies when installed in its operative position in the tiled display; whereby when the single display tile is located in the first position, there is a distance between the loading position and the operative position; the linear or rotational actuator is configured so that the distance becomes smaller as the single display tile is moved along the predetermined path towards the second position, whereby the linear or rotational actuator is accessible outside a perimeter or footprint of the single display tile and remains accessible in positions along the predetermined path, and remains accessible until an adjacent display tile is covering an access to the linear or rotational actuator.

2. An intermediary support structure according to aspect 1, wherein the predetermined path is a path at an angle to the X-axis of the XY-plane.

3. An intermediary support structure according to aspect 1 or 2, wherein the distance is a distance between the single display tile and one or more adjacent display tiles, whereby the distance is between adjacent lateral edges facing each other of respectively the single display tile and of the one or more adjacent display tiles.

4. An intermediary support structure according to any of the aspects 1 to 3, wherein the movement along the predetermined path generated by the linear or rotational actuator is controlled by a linear guide.

5. An intermediary support structure according to any of the aspects 1 to 4, in which the loading position is the position which the single display tile has during the initial placement thereof in the tiled display.

6. An intermediary support structure according to any of the aspects 1 to 5, in which the first position is the position in which the distance is larger than the nominal seam between the single display tile and one or more adjacent display tiles.

7. An intermediary support structure according to any of the aspects 1 to 4, configured so that the distance becomes equal to the seam between the single display tile and the one or more adjacent display tiles when the single display tile has reached the second position.

8. An intermediary support structure according to any of the aspect 1 to 7, wherein the single display tile and the intermediary support structure are a module configured to behave as a single body, whereby the relative position of the single display tile and the intermediary support structure with respect to each other is fixed in any position on the predetermined path.

9. An intermediary support structure according to any of the aspects 1 to 8, wherein the linear or rotational actuator is configured to be able to induce a movement from the first position to the second position.

10. An intermediary support structure according to any of the aspects 1 to 9, in which the linear or rotational actuator is a hand-driven actuator.

11. An intermediary support structure according to any of the aspects 1 to 10, in which the linear or rotational actuator is a motor-driven actuator.

12. An intermediary support structure according to any of the aspects 1 to 11, in which the linear or rotational actuator is selected from a rack and pinion system, an over centered cam, an articulated lever, over centered articulated lever, a wedged cam.

13. An intermediary support structure according to any of the aspects 1 to 12, which is configured to lie between the single display tile and the support structure.

14. An intermediary support structure according to any of the aspects 1 to 13, further comprising coupling means or fastening means configured for coupling or fastening the intermediary support structure to a single display tile.

15. An intermediary support structure according to aspect 14, wherein the coupling or fastening means comprises holes that are configured to mate with protrusions such as pins on the single display tile or vice versa.

16. An intermediary support structure according to aspect 15, configured so that the pins and/or holes of the intermediary support structure and the corresponding holes and pins on the back surface of the single display tile are mated and the single display tile and the intermediary support structure behave like a solid body.
17. An intermediary support structure according to any of the aspects 1 to 16, configured to be at least partially or temporarily supported by the support structure.
18. An intermediary support structure according to any of the aspects 17, wherein the linear or rotational actuator is self-guided.
19. An intermediary support structure according to any of the aspects 1 to 18, wherein the single display tile is in the second position and the linear or rotational actuator is autolocking to keep the single display tile in its second position.
20. An intermediary support structure according to any of the aspect 1 to 19, wherein fastening means for fastening the intermediary support structure to the support structure are distributed along one side of the single display tile or two adjacent sides of the single display tile.
21. A tiled display configured to be fastened to a support structure and including a plurality of intermediary support structures according to any of the aspects 1 to 20, wherein a plurality of display tiles of the tiled display is fastened to the support structure by means of intermediary support structures by means of a plurality of fastening means, whereby a single display tile is fastened to an associated intermediary support structure of the plurality of intermediary support structures.
22. A tiled display according to aspect 21, wherein a plurality of fastening means used to fasten the single display tile to the support structure are either on a single side or edge of the single display tile or are distributed along two abutting sides or edges of the single display tile.
23. A method for installing a display tile in a tiled display, comprising the steps of
supporting a single display tile of the tiled display with an intermediary support structure;
moving, by means of a linear or rotational actuator, the single display tile from a first position in a first plane, which the first plane is parallel to the XY-plane of the single display tile, along a predetermined path to a second position in the first plane, whereby the first position is a loading position of the single display tile in the tiled display and the second position is a position in which the single display tile lies when installed in its operative position in the tiled display; whereby when the single display tile is located in the first position, there is a distance between the loading position and the operative position; whereby the distance becomes smaller as the single display tile is moved along the predetermined path towards the second position, whereby the linear or rotational actuator is accessible outside a perimeter or footprint of the single display tile and remains accessible in positions along the predetermined path, and remains accessible until an adjacent display tile is covering an access to the linear or rotational actuator.

The following are aspects of some embodiments of the present invention starting with aspect 24 and going up to aspect 104:

24. An intermediary support structure with fastening means for fastening to a back side of a display tile, the display tile having several edges and a perimeter or footprint, further comprising a first fastener or first fastening means for fastening the intermediary support structure to a support structure supporting multiple display tiles, the intermediary support structure being characterized by:
the first fastening means for fastening to a support structure being distributed along one edge of the display tile or along two adjacent edges of the display tile; and
said first fastening means for fastening to a support structure being located outside of the perimeter or footprint of the display tile,
said fastening means extending beyond the perimeter or footprint of the display tile by a distance D that is larger than the nominal seam between two adjacent display tile of the tiled display and
said fastening means are configured to be accessed from the display side of the display tile. It is an advantage that it simplifies the tiling of display tiles when the distance, referred to as the seam between adjacent tiles, is too small to allow access to fastening means. The intermediary support structure can have additional attachment means to attach the display tile to a tool for alignment of the display tile with one or more display tiles already fastened to the support structure.
25. An intermediary support structure according to aspect 24 wherein a seam between adjacent tiles is too small to allow access to said fastening means.
26. An intermediary support structure according to aspect 24 or 25 further comprising attachment means to attach the display tile to a tool for alignment of the tile with one or more tiles already fastened to the support structure.
27. An intermediary support structure according to aspect 26 wherein the attachment means are on the same side or sides as the first fastening means for fastening to the support structure.
28. An intermediary support structure according to aspect 26 or 27 wherein the attachment means for attachment to the tool are adjacent to the first fastening means for fastening to the support structure.
29. An intermediary support structure according to any of the aspects 24 to 28 wherein the intermediary support element supports a single tile.
30. An intermediary support structure according to any of the aspects 24 to 29 which is configured to lie between the display tile and a support structure such as a frame or wall when in operation.
31. An intermediary support structure according to any of the aspects 24 to 30 in which the support structure is configured to support multiple display tiles to form a tiled display.
32. An intermediary support structure according to any of the aspects 24 to 31 wherein the support structure is a metallic plate.
33. An intermediary support structure according to aspect 32 wherein the metallic plate has first openings (401, 402, 403) optionally located at regular intervals.
34. An intermediary support structure according to aspect 33 wherein the first openings are for receiving first fasteners or first fastening means like e.g. bolts and optionally nuts which are loose or are fixed to the first openings to fasten display tiles to the support structure or to fasten an intermediary structure.

35. An intermediary support structure according to any of the aspects 24 to 34 wherein said intermediary structure is configured to carry a single display tile.
36. An intermediary support structure according to any of the aspects 32 to 35 wherein the metal plate has stiffening means.
37. An intermediary support structure according to aspect 36 wherein the stiffening means comprises corrugations, or tubes fastened to the metal plate.
38. An intermediary support structure according to aspect 36 or 37 further comprising second fastening means.
39. An intermediary support structure according to aspect 38 wherein the second fastening means is for fastening the metal plate to a wall or to support trusses.
40. An intermediary support structure according to any of the aspects 24 to 39 wherein the width of a seam, which is the distance between adjacent display tiles, does not allow to access first fastening means through the seam.
41. An intermediary support structure according to any of the aspects 24 to 40 wherein the intermediary support element has third means for fastening to a support structure.
42. An intermediary support structure according to aspect 41, wherein the third fastening means include second openings (504A, 504B and 504C).
43. An intermediary support structure according to aspect 42 wherein the second openings are each located on one extremity of three extremities of a Y-shaped or T-shaped device.
44. An intermediary support structure according to aspect 44 wherein elongate fasteners are configured to pass through each second opening and a corresponding opening in the support structure.
45. An intermediary support element according to any of the aspects 24 to 44 further comprising coupling means or fastening means adapted for coupling or fastening the intermediary support element to a display tile.
46. An intermediary support structure according to aspect 45 wherein the coupling or fastening means comprise holes that are configured to mate with protrusions such as pins on the display tile.
47. An intermediary support structure according to aspect 45 or 46 wherein the coupling or fastening means comprise protrusions such as, for example, pins that are adapted to mate with holes on the display tile.
48. An intermediary support structure according to any of the aspects 24 to 47 further comprising second coupling means (505A, 505B and 505C) configured for manipulating the display tile without risk of damaging the display surface of the display tile.
49. An intermediary support structure according to any of the aspects 24 to 48 wherein the display tile has a first surface (601) that is a front surface or display surface and a second surface (602) that is a back surface.
50. An intermediary support structure according to aspect 49 wherein the back surface (602) has a fastener optionally fastening means to be fastened to the intermediary support element
51. An intermediary support structure according to aspect 50 wherein the fastener or fastening means comprises pins and/or holes that mate with corresponding holes and/or pins on the intermediary support element.
52. An intermediary support structure according to aspect 50 or 51 wherein the intermediary support element is screwed and/or glued to the back surface of the display tile.
52'. An intermediary support structure according to aspect 52 wherein, once the pins and/or holes of the intermediary support elements and the corresponding holes and pins on the back surface are mated, the display tile and the intermediary support element behave like a solid body.
53. An intermediary support structure according to any of the aspects 48 to 52' wherein the second coupling means (505A, 505B and 505C) are each located on one extremity of the Y-shaped or T-shaped device, respectively.
54. An intermediary support structure according to aspect 53 wherein the second coupling means (505A, 505B and 505C) include a third opening located adjacent a second opening (504A, 504B, 504C), respectively.
55. An intermediary support structure according any of the aspects 24 to 54 wherein a second opening has a diameter D1, that is larger than the diameter of the opening 401 in the support structure.
56. An intermediary support structure according to aspect 55 configured to compensate for tolerances affecting the support structure, in particular the position of the openings (401, 402, 403, . . . ) and to allow for a nominal alignment of the display tiles.
57. A tiled display including an associated intermediary support structure according to any of the aspects 24 to 56 wherein a first tile 801 is fastened to the support structure 400 by means of its associated intermediary support structure by means of a plurality of fastening means 8014A, 8014B and 8014C.
58. A tiled display according to aspect 57, wherein a second tile 802 is located next to the first tile.
59. A tiled display according to aspect 58, wherein the second tile 802 is located to the right of the first tile 801.
60. A tiled display according to aspect 59, wherein, when the second tile 802 is in its nominal position, the fastening means 8014C associated with the first tile 801, is under the second tile 802, but the fastening means 8024A, 8024B and 8024C associated with the second tile 802, are still accessible to introduce a fastening means such as a bolt which fastens the second tile 802 to the support structure.
61. A tiled display according to any of the aspects 58 to 60 wherein a third tile 803 is located next to the second tile.
62. A tiled display according to aspect 61 wherein the third tile 803 is located to the right of second tile 802.
63. A tiled display according to aspect 62, wherein, when the third tile 803 is in its nominal position, the fastening means 8024C associated with the second tile 802 is under the third tile 803 but the fastening means 8034A, 8034B and 8034C associated with the third tile 803 are still accessible to introduce a bolt and fasten the third tile 803 to the support structure.
64. A tiled display according to any of aspects 61 to 63 wherein a fourth tile 804 is located above the first tile 801.
65. A tiled display according to any of the aspects 61 to 64, wherein, when the fourth tile 804 is in its nominal position, the fastening means 8014A and 8014B are under the fourth tile 804, but the fastening means 8044A, 8044B and 8044C associated with the fourth tile 804 are still accessible to introduce bolts and fasten the tile 804 to the support structure.

66. A tiled display according to any of the aspects 61 to 65 wherein a fifth tile 805 is located to the right of the fourth tile 804 and above the second tile 802.
67. A tiled display according to aspect 66 wherein, when the fifth tile 805 is in its nominal position, the fastening means 8044C associated with the fourth tile and the fastening means 8024A and 8024B associated with the second tile 802 are under the fifth tile 805, but the fastening means 8054A, 8054B and 8054C associated with the fifth tile 805 are still accessible and the fifth tile 805 can be fastened to the support structure.
68. A tiled display according to any of the aspects 57 to 67, wherein access is provided to the plurality of fastening means during assembly of the tiled display from a front surface of the tiled display device even though the fastening means are larger than the distance between two adjacent display tiles.
69. A tiled display according to any of the aspects 57 to 68 wherein the plurality of fastening means are distributed along a single side or edge of the display tile.
70. A tiled display according to any of the aspects 57 to 69 wherein the plurality of fastening means used to fasten the display tile to the support structure are either on a single side or edge of the display tile or are distributed along two abutting sides or edges.
71. A tiled display according to any of the aspects 57 to 70 wherein an alignment of adjacent display tiles is done with the help of a spacer.
72. A tiled display according to aspect 71 wherein a spacer is made of an elastic material such as hard rubber with a thickness equal to the nominal seam between adjacent display tiles.
73. A tiled display according to aspect 71 or 72 wherein the spacers 114*a* and 114*b* are attached to each other and form a right angle.
74. A tiled display according to any of the aspects 57 to 73 comprising means to manipulate a display tile without having to contact its display surface, the means including a tool fastened to the intermediary support structure by means of fastening means (1105A, 1105B, 1105C on FIG. 11; 505A, 505B, 505C on FIG. 5)
75. A tiled display according to aspect 74 wherein the fastening means 1105A, 1105B, 1105C and/or fastening means 505A, 505B, 505C are part of a Y-shaped or T-shaped structure which includes means for fastening to a support structure, namely, openings 504A, 504B and 504C.
76. A tiled display according to aspect 74 or 75 wherein the fastening means for fastening to the tool are distributed along the same side(s) or edge(s) as the fastening means for fastening to the support structure.
77. A tiled display according to aspect 76, wherein the number and disposition of fastening means for fastening to the tool are the same as the number and disposition of fastening means for fastening to the support structure.
78. A tiled display according to any of the aspects 74 to 77 wherein the tool comprises handles that allow manipulation of the display tile by a human agent without contact with the display surface.
79. A tiled display according to any of the aspects 74 to 78 wherein the tool is fastened to the intermediary support element and the display tile at the same positions as the fastening means for fastening to the support structure, so that the display tile is positioned and fastened to the support structure at its nominal position without impediment by the tool, even if the dimensions of the fastening means for fastening to the tool are larger than the size of the seam.
80. A tiled display according to any of the aspects 57 to 78 wherein the positioning of the display tiles can be automated.
81. A tiled display according to any of the aspects 74 to 80 wherein the display tile is fastened to the tool and is translated and/or rotated by means of one or more motors and the relative position of the display tile with respect to one or two adjacent display tiles is monitored by one or more sensors.
82. A tiled display according to aspect 81 wherein the sensor is an optical camera or image sensor or, alternatively, the sensor is any sensor that can evaluate the distance between adjacent display tiles.
83. A tiled display according to aspect 82 wherein the distance between adjacent display tiles is evaluated on the basis of the position of adjacent corners of adjacent display tiles.
84. A tiled display according to any of the aspects 57 to 83 wherein alignment of display tile 121 with respect to display tile 120 can be evaluated by:
    The distance db between the bottom left corner 121*b* of display tile 121 and the bottom right corner 120*b* of display tile 120; and
    The distance da between the top left corner 121*a* of display tile 121 and the top right corner 120*a* of display tile 120.
85. A tiled display according to aspect 84, in which if the distances da and db are different, then the right side 120R of display tile 120 is not parallel to the left side 121L of display tile 121 and if the sides 120R and 120L are not parallel, a motor can rotate the display tile by e.g. applying a torque to the display tile by the intermediary of the tool fastened to the display tile 121 by means of the fastening means 1215A, 1215B and 1215C.
86. A tiled display according to aspect 84 or 85 wherein if both distances da and db are equal but different from a nominal distance d0, the display tile 121 can be translated by the intermediary of the tool.
87. A tiled display according to any of the aspects 57 to 86 wherein if the two tiles are aligned, one display tile 121 is fastened to the support structure with the fastening means 1214A, 1214B and 1214C.
88. A tiled display according to any of the aspects 57 to 67 wherein the alignment of a display tile 132 is made by monitoring the relative positions of three of its corners (132*a*, 132*b*, 132*c*) with respect to the corners of display tile 130 (corners 130*a* and 130*b* on the right side of the display tile 130) and of display tile 131 (corners 131*a* and 131*b* on the top side of display tile 131).
89. A tiled display according to aspect 88 wherein the distances between corners of tile 130 and the corresponding corners of tile 132 are evaluated as well as the distance between corners of tile 132 and the corresponding corners of tile 131:
    The distance db1 between the bottom left corner 132*b* of display tile 132 and the bottom right corner 130*b* of display tile 130; and
    The distance da1 between the top left corner 132*a* of display tile 132 and the top right corner 130*a* of display tile 130,
    The distance da2 between the top left corner 131*a* of display tile 131 and the bottom left corner 132*b* of display tile 132; and The distance db2 between the top right corner 131*b* of display tile 131 and the bottom right corner 132*c* of display tile 132.

90. A tiled display according to aspect 89 wherein if the right side 130R of display tile 130 is parallel to the left side 132L of display tile 132, then the distances da1 and db1 are equal.
91. A tiled display according to aspect 89 wherein if the top side 131Top of display tile 131 is parallel to the bottom side 132Bot of the display tile, then the distances da2 and db2 are equal.
92. A tiled display according to any of the aspects 90 or 91 wherein if the distances da1, da2, db1 and db2 differ from their nominal value, wherein the nominal value is the value when the seam is as expected, it is necessary to translate the display tile 132.
93. A tiled display according to any of the aspects 57 to 92 wherein the display tile and the intermediary support structure are attached to one another by means of pins and holes, and if one of the tiles is damaged, it is extractable while leaving the intermediary support structure fastened to the support structure.
94. A tiled display according to any of the aspects 57 to 93 further comprising trusses arching over the display surfaces which interact with the fastening means like disposed around one or two abutting sides of the display tile.
95. A tiled display according to any of the aspects 57 to 94 wherein two or three sensors are fastened to a tool so as to have the corners of the display tile in their respective field of view.
96. A tiled display according to aspect 95, wherein the sensors are image sensors.
97. A tiled display according to any of the aspects 88 to 96 wherein the corners to be monitored are the corners which are closest to the display tiles already fastened to the support structure (e.g. 400) with which the display tile is aligned.
98. A tiled display according to aspect 97 wherein if the means for fastening to the support structure are along the top and right side of a display tile, cameras have in their field of view the top left corner the bottom left corner and the bottom right corner, respectively.
99. A tiled display according to aspect 97 wherein the corners that used to evaluate the seam or the distance between display tiles are those corners that are part of the sides where there are no fastening means for fastening to the support structure and no fastening means for fastening to the tool.
100. A tiled display according to aspect 99 wherein the tool is fastened to an XY motorized gantry mechanism.
101. A tiled display according to aspect 100 wherein the motors of the gantry mechanism are controlled by controlling means like a microcontroller that uses the reading of the sensors to determine how the motors must be driven to bring the readings to their desired value.
102. A tiled display according to any of the aspects 89 to 101 wherein the distances da1, da2 are derived in any way known to the art, wherein when the sensors are cameras, ad-hoc image processing is used to determine the distances.
103. A tiled display according to aspect 102 wherein the distances are derived from images taken by the image sensor by, for example, counting the number of pixels that separate specific points indicated on the surface of the display tiles in the vicinity of the corners on each display tile.
104. A tiled display according to aspect 103 wherein one pixel at the apex of each corner is flashed on and off to facilitate its identification optionally by subtracting two consecutive images and thresholding, leaving only the flashing pixels.

Any of the aspects 1 to 23 can be combined with any of the aspects 24 to 104.

BRIEF DESCRIPTION OF THE FIGURES

FIGS. 7*a* and 7*b* illustrate an example of fastening means and how they can compensate for the tolerances affecting the support structure.

FIGS. 21a and 21b show another example of an intermediary support structure. In these drawings it is a possible alternative of the intermediary support structure shown in FIGS. 14-20. It is mainly rectangular. Moreover, another example of an actuator is shown, namely a rotational cam (excentre).

FIGS. 22a and 22b show another example of an intermediary support structure. In these drawings it is a possible alternative of the intermediary support structure shown in FIGS. 14-20. It is mainly rectangular. Moreover, another example of an actuator is shown, namely an articulated lever lying in a plane.

The intermediary support structures which are completely visible and on which a display tile has not yet been fastened are in the first position.

Figure 24:
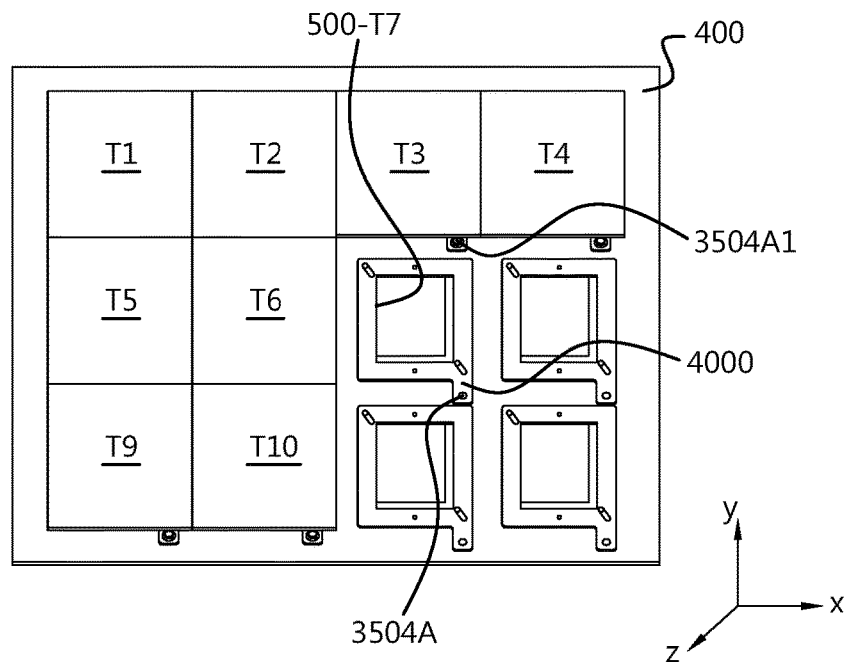
FIG. 24 shows show another example of an intermediary support structure. It is a possible alternative of the intermediary support structure shown in FIGS. 14-20. It is mainly rectangular.
Figure 25:
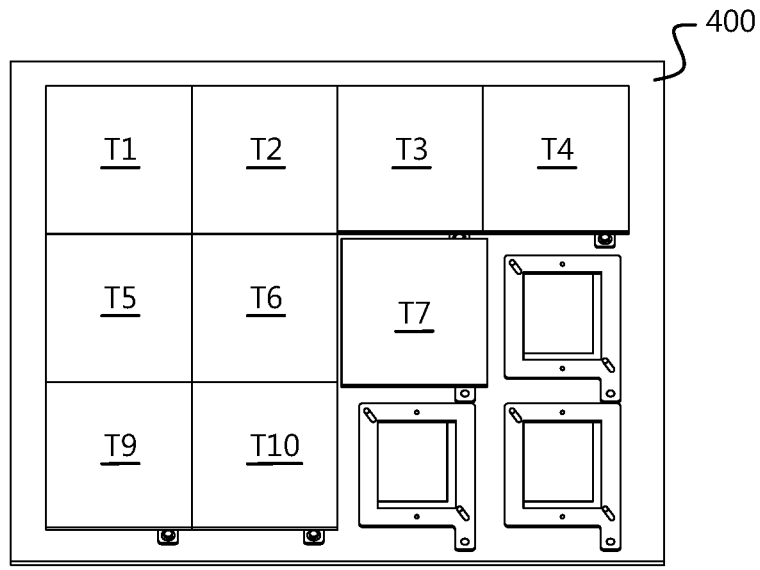

FIG. 25 shows the example of FIG. 24 and in FIG. 25 the intermediary support structure on which a display tile T7 has been loaded, is in the first position.

Figure 26:
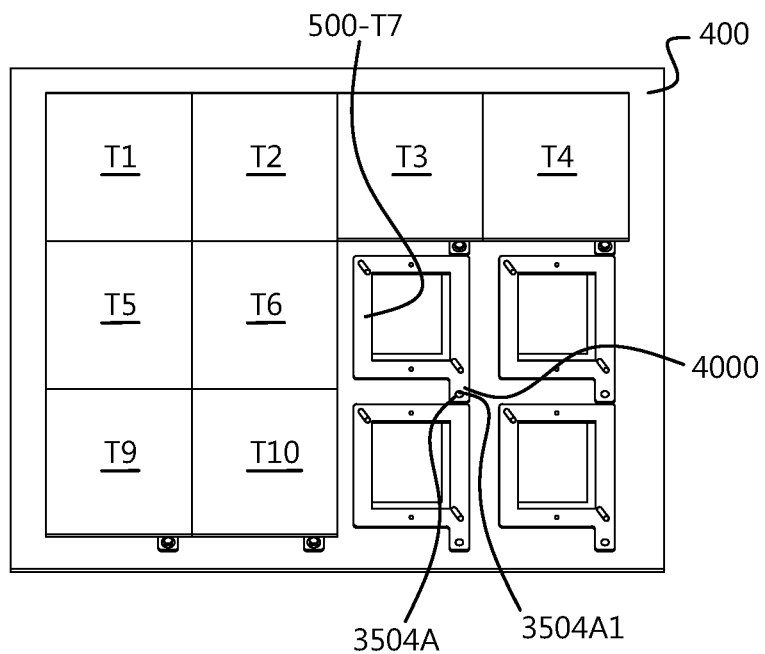

FIG. 26 shows the example of FIGS. 24-25. FIG. 26 shows the intermediary support structure, on which display tile T7 has been loaded (but not shown in FIG. 26 so that the intermediary support structure can be seen completely for clarity of explanation in the below Detailed Description), in the second position.

Figure 27:
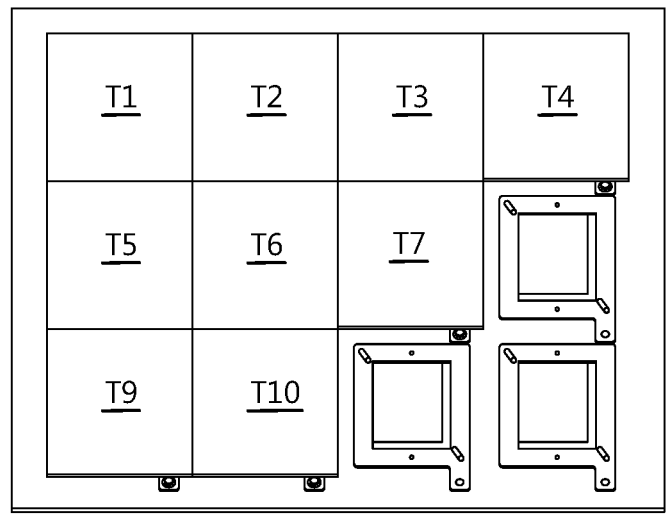

FIG. 27 shows the example of FIG. 26. In FIG. 27, display tile T7 and its intermediary support structure are in the second position, thanks to the movement induced by the (linear or rotational) actuator described above with respect to FIG. 14 to FIGS. 23a-b.

Figure 28:
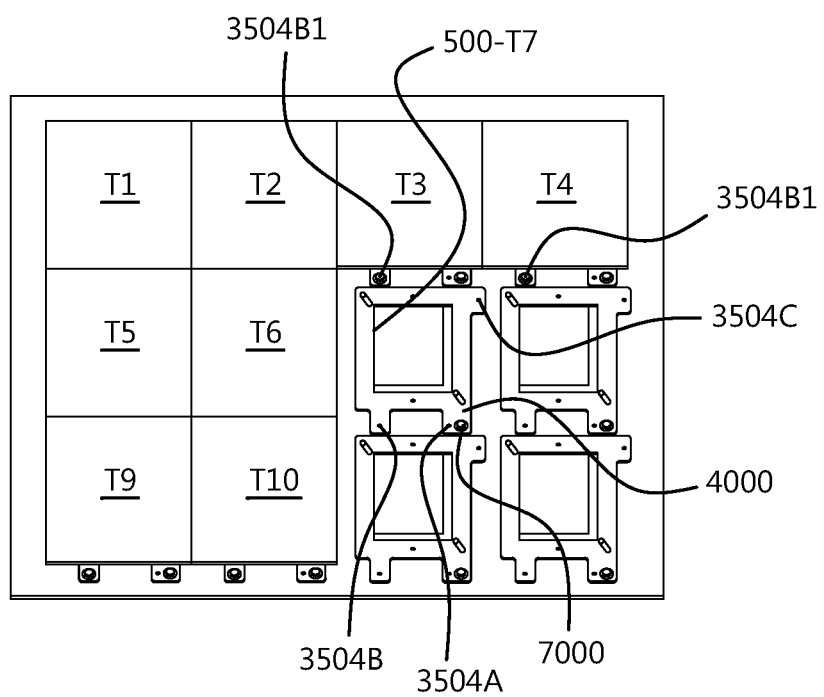

FIG. 28 shows an alternative of the intermediary support structure shown in FIG. 24 to 27.

FIGS. 29A, 29B, 29C show an alternative guide element in an intermediate support structure compared to the guide element shown in FIGS. 14 to 28.

DEFINITIONS AND ACRONYMS

Display Element. An element of a display may be emissive, i.e. light is emitted from a front surface. The emission can be the result of activating light sources located in the display or the display can be transparent and light from a light source may be transmitted through the display before being emitted from the front surface of the display. Examples of emissive display elements are LED, OLED, plasma display, backlit liquid crystal display or light valve or a reflective liquid crystal display or light valve, etc.

Examples of reflective display elements are front lit liquid crystal light valve.

A Pixel is a picture element being an addressable unit, a plurality of which provides the capacity of a display tile or a display to display an arbitrary image.

A Display Tile has a front side or surface and a back side or surface. The front and back side are first and second major surfaces as these are the largest. The front side is the side which has light emitting pixels. The display tile has lateral sides or edges.

If a display tile is rectangular in shape, then there are four lateral sides or edges. Pairs of lateral sides oppose each other and are parallel to each other. A lateral side or edge is perpendicular to the adjoining lateral side or edge.

LED. Light Emitting Diode.

OLED. Organic Light Emitting Diode.

Nominal. According to plans, as expected. Relating to a designated or theoretical size. In particular, the nominal display plane (or nominal plane of the tiled display) is the ideal planar surface across which images are to be displayed. The nominal display plane is expected to comprise the display surface of each of the display tiles of the tiled display. For instance, in the example of FIGS. 24-28, the nominal display plane is the XY plane. The nominal display surface is the surface formed by the sum of the display surface of the tiles T1 to T12 (the tiles being symbolized by 12 rectangles on the figure).

Permanent joint can only be separated by causing damage to the materials used in the joint. A permanent joint is usually designed to be a joint where it is unlikely that the joint will be dismantled under any servicing situation.

Semi-permanent joint: can be dismantled at least on a limited number of occasions, but may result in loss or damage to the fastening system and/or material included within the joint. Separation may require an additional process, for example plastic deformation. A semi-permanent joint can be used when disassembly is not performed as part of regular servicing, but for specific reasons.

Non-permanent joint: can be separated without special measures or damage to the fastening system and/or materials included within the joint. A non-permanent joint is suited to situations where regular dismantling is required, for example for regular maintenance.

Temporary joint: can be assembled and disassembled easily. An example is a magnet and a ferromagnetic material such as a steel sheet, hooks and loops such as Velcro™, hook and eye latch, as well as a pin and a hole for the pin or similar. Hook-and-loop fasteners, hook-and-pile fasteners or touch fasteners comprise two components: typically, two fabric strips which have a first component with tiny hooks, and a second component with small loops. Hooks and loops can be made from a plastic material. When the two are pressed together the hooks catch in the loops and the two pieces fasten or bind temporarily.

A counterbore is a cylindrical flat-bottomed hole allowing entry of a matched head of a bolt.

A countersink is a cone-shaped hole allowing a matched head of a bolt.

Intermediary support element/intermediary support structure: in the present description both words are used and mean the same.

Diagonal path: diagonal path is a path at an angle to the horizontal Y-axis or the vertical X-axis of the XY-plane. Such a diagonal path is straight and is limited in length by the display tile reaching the first or second position.

DETAILED DESCRIPTION OF EMBODIMENTS

In a first embodiment, an intermediary support structure or element is used to fasten a display tile to a support structure.

Each intermediary support element supports a single tile. The intermediary support element and its associated tile (usually a single tile) forms a "module". The support element is intermediary because it lies between the display tile and a support structure such as a frame or wall. The support structure supports multiple display tiles to form a tiled display. It is an advantage of embodiments of the present invention to be able to align adjacent display tiles to a high degree of precision and yet allow the support structure to be affected by tolerances worse than the required precision for the alignment. For instance, in one embodiment, the support structure can be a metallic plate as illustrated on FIG. 4. The metallic plate 400 has openings 401, 402, 403, for example at regular intervals. The openings 401, 402, 403 are for receiving fasteners or fastening means, like for example, permanent or semi-permanent joints such as bolts to fasten display tiles (footprint 404 indicates the position of a still to be fastened display tile) to the support structure or more precisely, as will be described later, to fasten an intermediary structure, said intermediary structure being able to carry a display tile. The tile and its associated intermediary structure form a module, whereby there is preferably only one tile in a module. The position of the openings like 401, 402, 403 . . . is affected by (determined by) tolerances that can be worse than the tolerance or precision required for the relative position of adjacent display tiles.

Figure 1A:
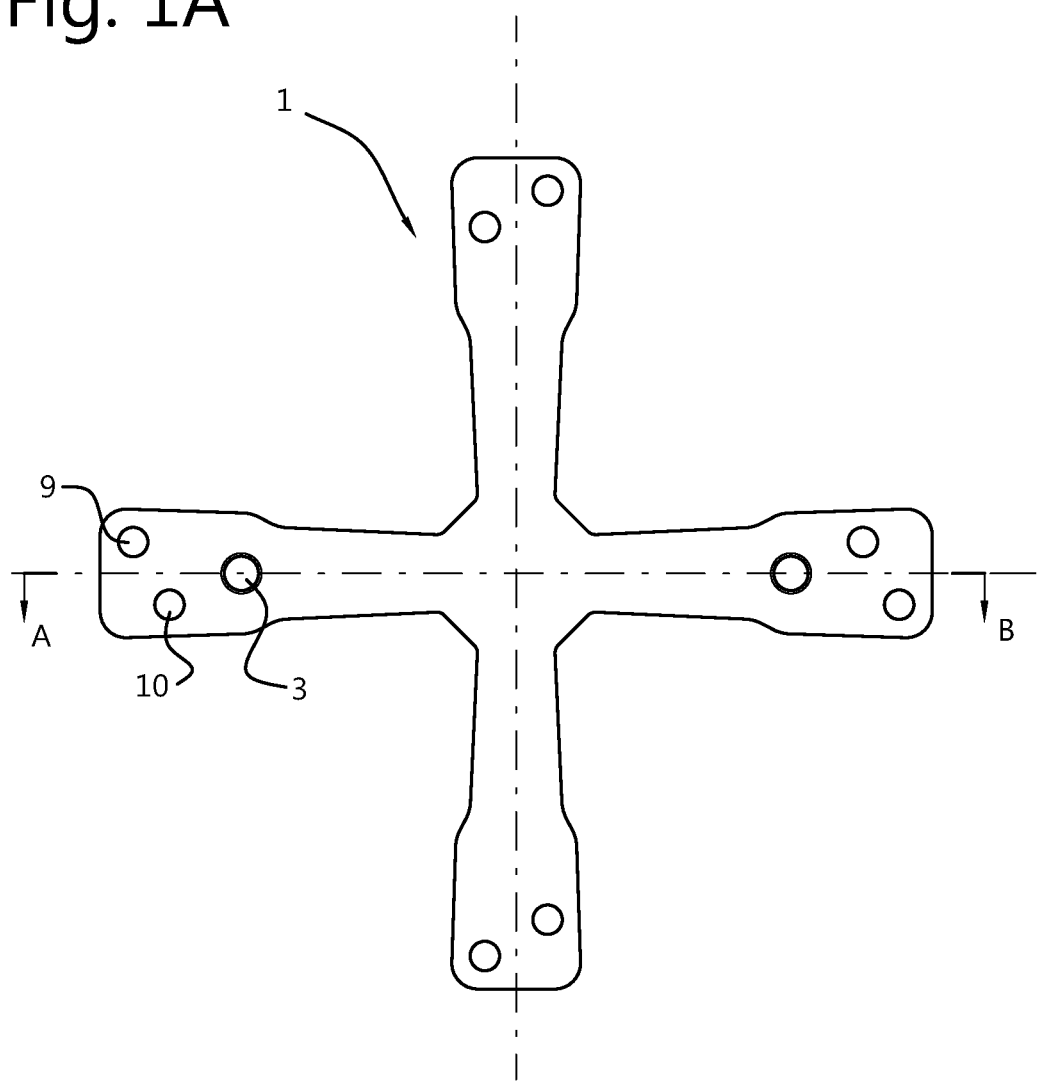
FIG. 1*a* shows a top view of a tile positioning device according to the prior art.
Figure 1B:
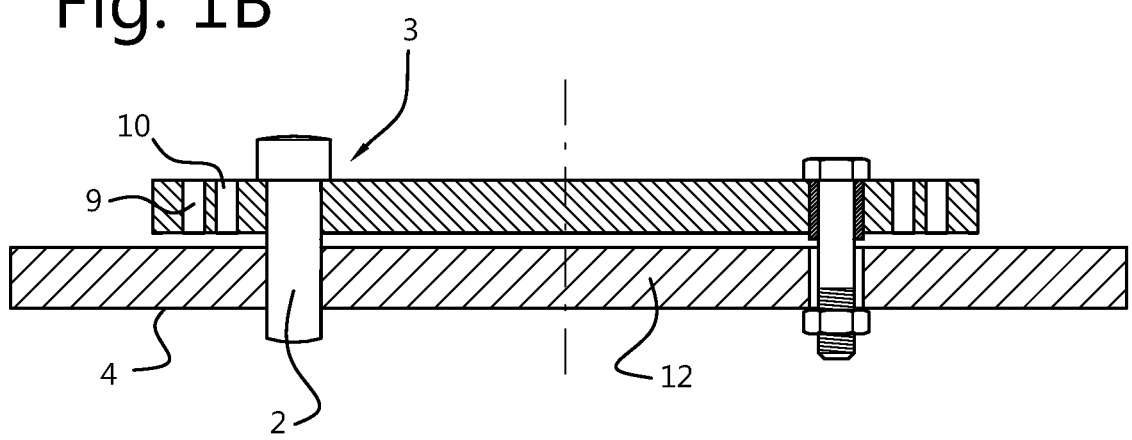
FIG. 1*b* shows a section view of a tile positioning device in accordance with the prior art.
Figure 2:
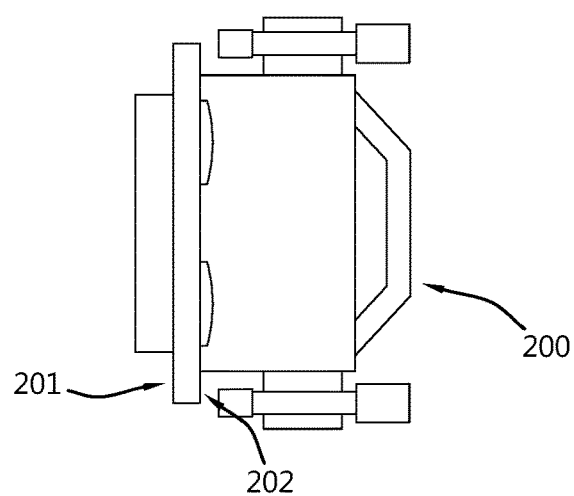
FIG. 2 illustrates a problem of the prior art (contact with surface of display tile).
Figure 3A:
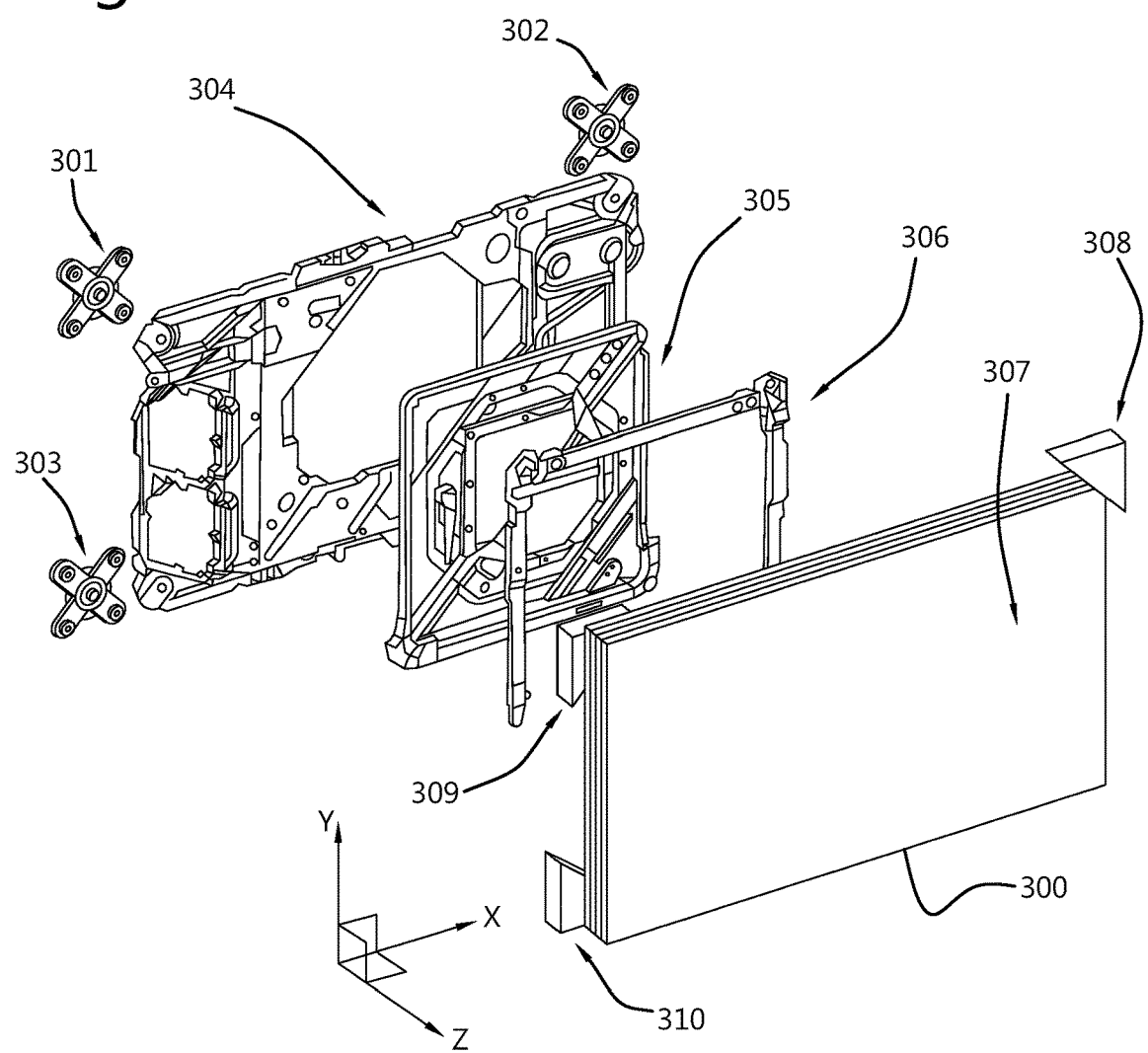
FIGS. 3*a* and 3*b* illustrate how a complex structure can be used to position a display tile with high precision while limiting contact with the display side of the tile.
Figure 3B:
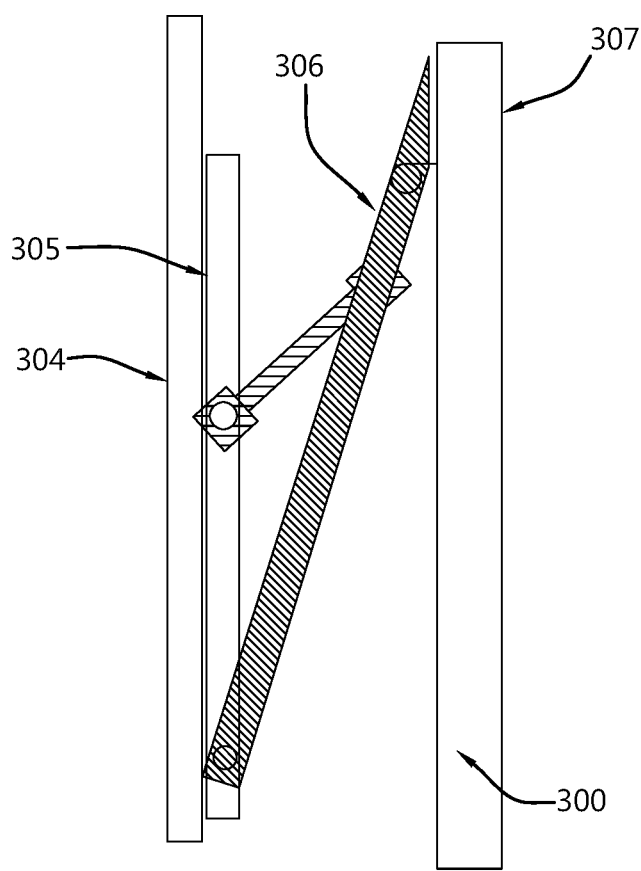
Figure 4:
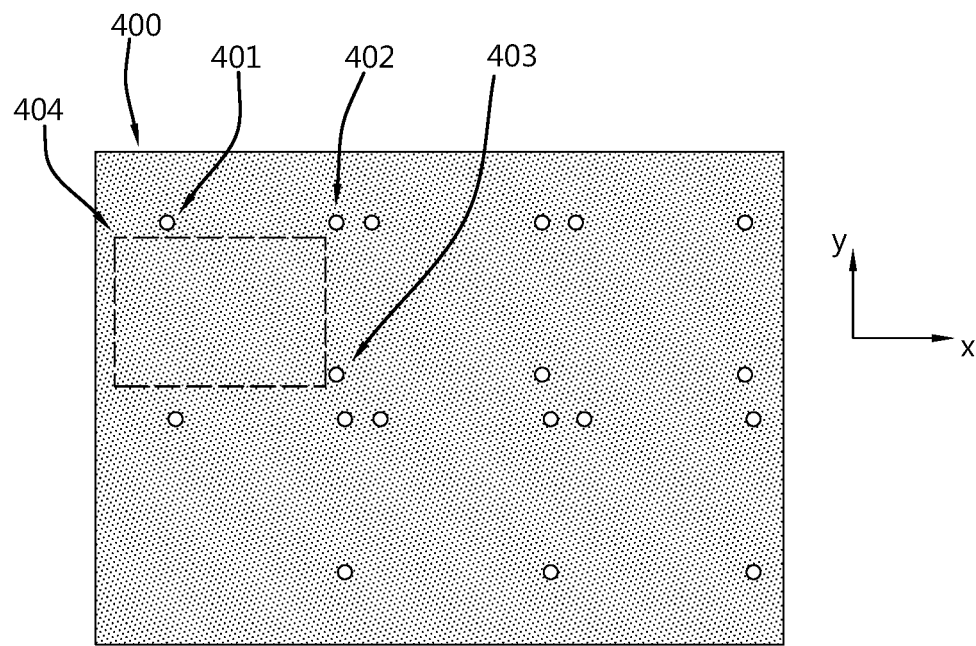
FIG. 4 shows an example of a support structure that can be used with the present invention.

In any of the embodiments, the metal plate 400 can have stiffening means not shown (e.g. corrugations, tubes fastened to the metal plate, etc.) as well as additional fastening means (e.g. for fastening the metal plate to a wall or support trusses) not shown on FIG. 4. The material with which the metal plate is made, can be a galvanized sheet, for example Zincor. A Zincor plate is an electrolytically galvanized steel sheet. The zinc coating can have a thickness of 2.5 microns. In most cases, DC01 steel type is used as the base material.

As will be described below, the intermediary support element solves several problems that affects high resolution tiled displays for which the seam (the distance between adjacent display tiles) is typically smaller than 1.2 mm and does not allow to access fastening means through the seam as the gap is too small.

Figure 5:
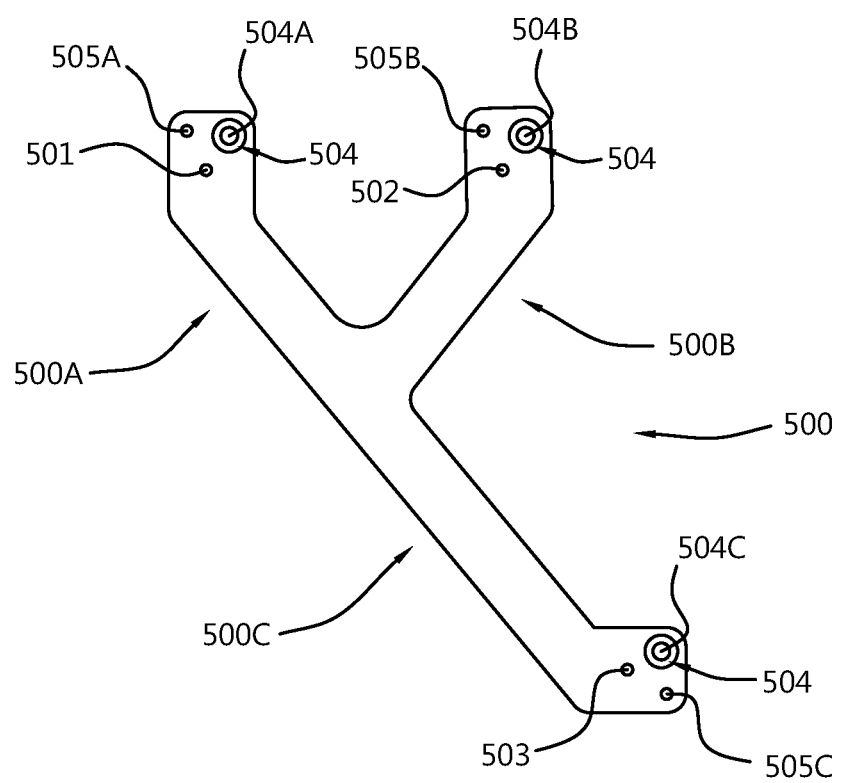
FIG. 5 shows an example of intermediary support structure according to an embodiment of the present invention.

FIG. 5 shows an example of intermediary support element 500 according to an embodiment of the present invention.

The intermediary support element 500 has means for fastening to a support structure 400. The fastening means can include, for example, openings 504A, 504B and 504C. Each of these openings 504A, 504B and 504C can be located at one extremity of a Y-shaped arrangement of openings (for example with legs 500A, 500B and 500C) or T-shaped arrangement or device or other shapes whereby one is a rectangular shaped device (for example as shown in FIGS. 21-28). A Y-shaped or T-shaped intermediate support structure can be lighter while fulfilling the same function as a mainly rectangular shaped intermediate support structure. Elongate fasteners such as bolts with nuts or a screw thread (not shown) can/will go through each opening (e.g. each one of 504A, 504B, 504C) and a corresponding opening, e.g. 401, 402, 403, respectively, in the support structure 400. In the examples of FIGS. 4 and 5: a first elongate fastener, which will form a semi-permanent joint or a non-permanent joint such as with a bolt, can go through opening 504A and opening 401, a second elongate fastener which will form a semi-permanent joint or a non-permanent joint, such as with a bolt, can go through opening 504B and opening 402 and a third elongate fastener which will form a semi-permanent joint or a non-permanent joint, such as with a bolt, which can go through opening 504C and 403. Any of the bolts can have nuts or a screw thread into which it screws. The intermediary support element 500 has coupling means or fastening means for coupling or fastening to a display tile, e.g. with a non-permanent joint, for example to one display tile. The coupling or fastening means can be for example holes 501, 502, 503 that can mate with protrusions such as pins on the display tile. Alternatively or additionally, the coupling or fastening means can be protrusions such as e.g. pins that can mate with or enter holes on the display tile. A footprint 404 of the display tile that will be coupled to the intermediary support structure 500 is indicated on FIG. 4.

The intermediary support element can be made, for instance, of sheet-metal aluminium (e.g. EN_AW-5052_ALMG2_5_H32). Other examples of material are injection moulding aluminium (e.g. EN_AC-42000_ALSI7MG_F) or injection moulding glass reinforced plastic (e.g. PPS).

In another embodiment, another coupling means 505A, 505B and 505C can be used for manipulating the display tile without risk of damaging the display surface of the display tile coupled to the intermediary support structure 500. Coupling means 505A, 505B and 505C can comprise holes each located on one of the three extremities of the T or Y-shaped device as illustrated on FIG. 5.

Alternatively, only two coupling means are used: for instance 505A and 505C.

In embodiments shown in FIGS. 14-28, such coupling means 505A, 505B and 505C may be present in the intermediary support structure but can also be left out as they are not required for a proper functioning.

Figure 6:
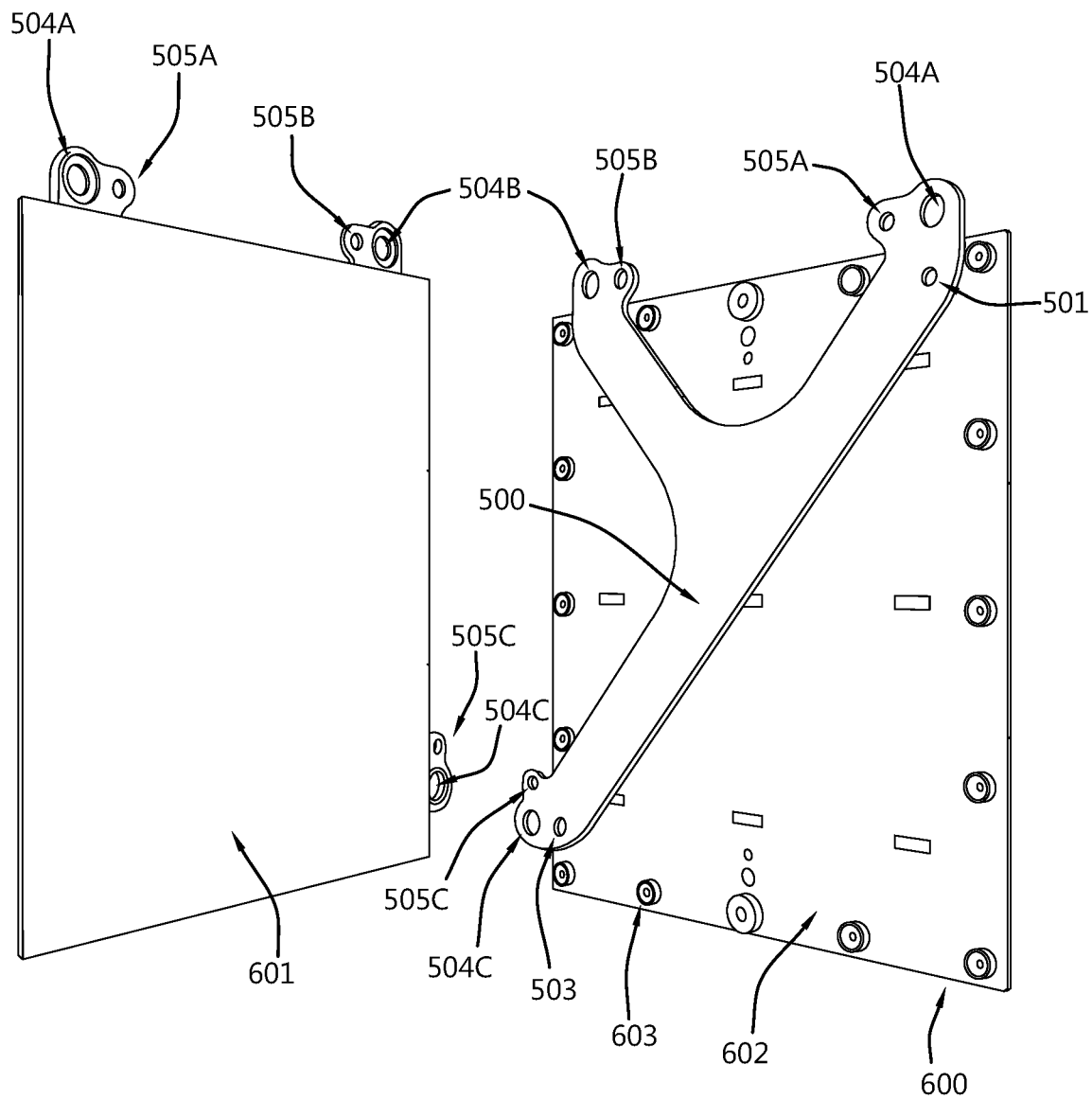
FIG. 6 shows an example of a display tile which is assembled according to an embodiment of the present invention.

FIG. 6 illustrates in a perspective view how the intermediary support element 500, e.g. in the form of the T-shaped or Y-shaped device, rectangular or other shaped device, is coupled to a display tile according to an embodiment of the present invention.

The display tile 600 has a first surface 601 that is a front surface or display surface. The first surface 601 is the surface on which display elements are visible. The display elements can be protected by a coating like, for instance, an anti-reflection coating. Such coating can, all too often, easily be scratched.

The display elements can be light sources such as, for example, Light Emitting Diodes or Organic Light Emitting Diodes. A display tile comprises an array of N×M light emitters such as LEDs or OLEDs. In the following, only LEDs will be mentioned, but each such mentioning includes the same disclosure with OLEDs and each such embodiment being herewith included in this disclosure. The array can be an array of sub-arrays with n×m LED where n<N and m<M. A sub-array of n×m LEDs can be mounted on a printed circuit board to form a so-called stamp.

Two or more stamps are assembled on a substrate of the display tile 500 to form an array of N×M LED.

The display tile has a second surface 602 that is a back surface. The back surface 602 can have fasteners such as fastening means to be fastened to the intermediary support element 500. The fastening means form a semi-permanent or non-permanent joint. The fastener or fastening means can be pins and/or holes that will mate with corresponding holes and/or pins on the intermediary support element 500. On FIG. 5, holes 501, 502 and 503 are drawn as illustrative examples.

Such holes 501, 502 and 503, when the intermediary support element 500 is installed (as shown in FIG. 6), do not or do not need to extend outside of the perimeter or footprint of the display tile. Holes 504A, 504B, 504C and holes 505A, 505B, 505C do extend outside of the perimeter or footprint of the display tile (as shown in FIG. 6). The position of holes 504A, 504B, 504C and corresponding holes 505A, 505B, 505C, respectively, may be as shown as an example in FIG. 5 or, alternatively, as shown as another example in FIG. 6. In the embodiments shown in FIGS. 14-28, such coupling means or holes 505A, 505B and 505C may be present in the intermediary support structure but can also be left out.

Alternatively, the intermediary support element 500 can be screwed and/or glued to the back surface 602 of the display tile 600. In yet another alternative embodiment, the intermediary support element 500 can be integral to and with the display tile 600.

Embodiments of the invention for which the intermediary support element 500 is not an integral part of the display tile 600, have an advantage. Once a tiled display has been assembled, it is then possible to remove a display tile in particular while leaving the corresponding intermediary support element fastened to the support structure and replace the display tile by another display tile, for example, for repair.

Removing the display tile, while leaving the intermediary support element, can be done in different ways. In a first example, if the seam is large enough, a hook like structure can be inserted to exert a force on the display tile in a direction normal to the display surface (along Z-direction) and "rip" the display tile apart from the intermediary support element.

If the seam is not large enough and/or if the risk of damaging a neighboring display tile is deemed too high, it is possible to disengage display tiles from their respective intermediary support element in the reverse order with respect to how they were first tiled, until one reaches the display tile that must be replaced. Once that tile has been replaced, the tiles that were removed are fastened again to their respective intermediary support elements. No new alignment needs to be performed, since the intermediary support elements remained fastened to the support structure and since these intermediary support elements compensate for the tolerances affecting the support structure. Once the pins and/or holes of the intermediary support elements 500 and the corresponding holes and/or pins on the back surface 602 are mated, the display tile and the intermediary support elements 500 behave like a solid body, i.e. they form a module.

The intermediary support element 500 and its display tile can be fastened to the support structure. Fastening to the support structure can be done, for instance, by means of suitable fasteners or fastening means, for example, a semi-permanent or non-permanent joint such as with bolts inserted through the openings 504A, 504B and 504C of the element 500, one bolt being inserted through one opening, and the corresponding openings 401, 402 and 403 of the support structure 400.

Figure 7A:
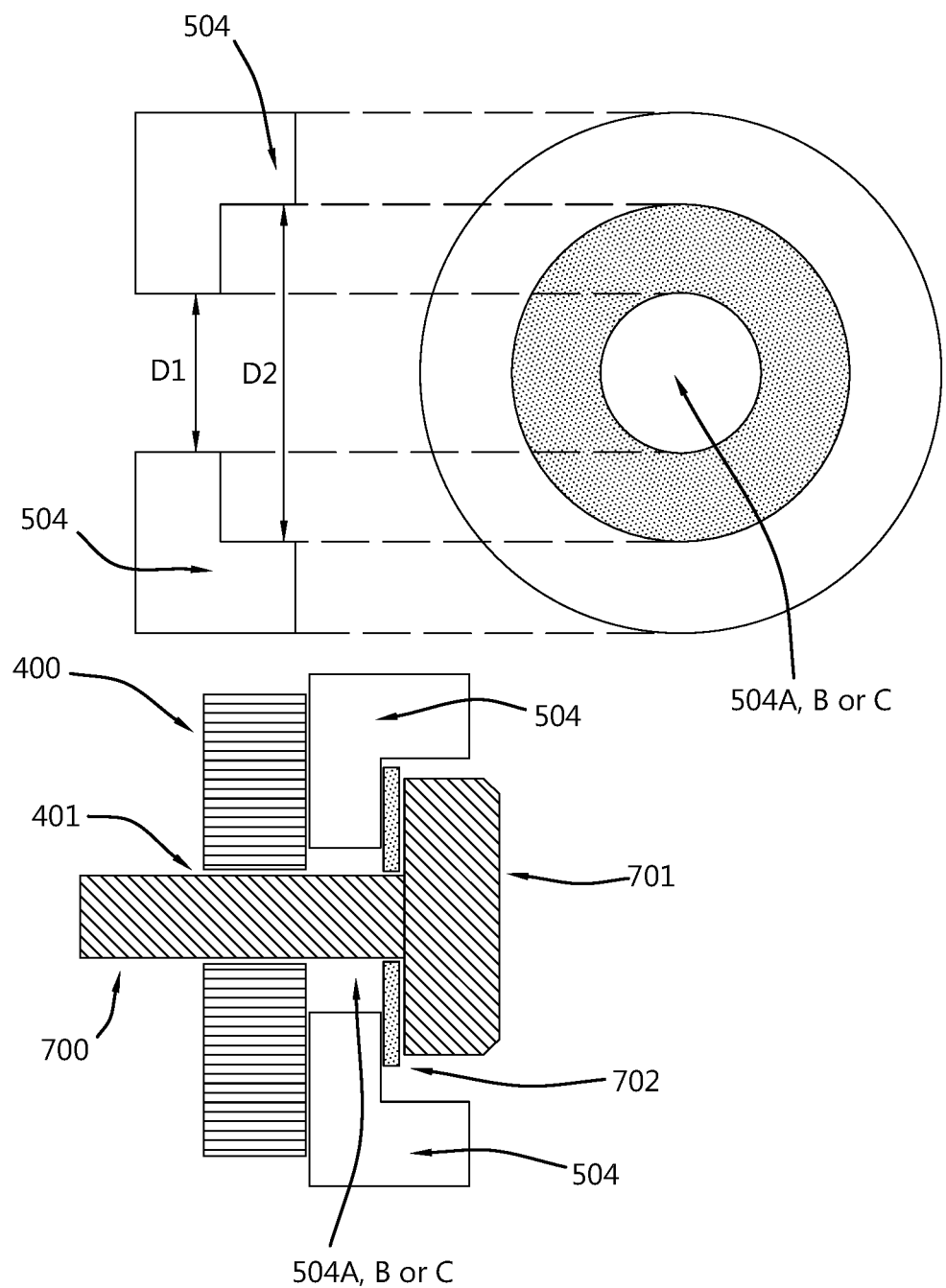

FIG. 7a shows a top and side view of an opening like 504A, 504B or 504C. For example, the opening 504A has a diameter D1 that is larger than the diameter of the opening 401 in the support structure 400.

A module comprising a display tile is preferably made as separate parts. This is to be able to disassemble a module or a display tile in servicing or maintenance mode, without having to remove the modules or display tile next to it. To achieve this, a module or display tile can be released from its intermediary structure 500, while leaving the intermediary structure 500 mounted.

This difference is useful to compensate for tolerances affecting the support structure (in particular the position of the openings 401, 402, 403, etc.) and to allow for a nominal alignment of the display tiles. This compensation for tolerances is illustrated in FIGS. 7a and 7b. Even if the opening 401 and the opening 504A (504B, 504C) are not perfectly aligned, a bolt 700 can still be inserted through the opening 504A (504B, 504C) in part 504, which is a fixing part in the intermediary structure 500 and which is counterbored or countersunk, and the opening 401 in the support structure 400. The diameter of the head 701 of the bolt 700 is larger than the diameter D1 of the opening 504A (504B, 504C). Alternatively, a washer 702 with an outside diameter larger than D1 can be used. The diameter of the head 701 and/or of the washer 702 is smaller than a diameter D2 of the outer diameter of fixing part 504.

In yet another embodiment of the invention, the intermediary support element 500 can be partially supported by the support structure 400 during assembly by means of a temporary joint as can be provided by magnets before being fastened in place with bolts. The magnets can be glued or screwed to the intermediary support element 500. An advantage is that even while the weight of the display tile is supported by the support structure 400, it is possible to glide the intermediary support element 500 and the display tile attached to it, into position. An advantage is that even while the weight of the display tile is supported by the support structure, it is possible to glide the intermediary support element and the display tile attached to it, into position.

Magnets are preferably firmly mounted on the module and are attracted magnetically to the support structure which contains ferromagnetic material. The Y- or T-shaped, rectangular or other shaped intermediary support structure is located in between. To form joints, the magnets should be attracted to ferromagnetic material such as steel. The module is attracted magnetically in the Z-direction, e.g. with force of approximately 10 kg to the Zincor plate and can slide over the plate with force of approximately 4 kg. If frictional forces need to be reduced, this can be done with suitable coatings such as PTFE. Indeed, it should be easy to slide during alignment and strong enough to stay in place in Z-direction. In the XY plane, the module remains in place by securing the intermediary support element 500.

An example of a magnet that can be used, is a Neodymium (NdFeB) pot magnet sold by Webcraft GmbH (Industriepark 206 78244 Gottmadingen, Germany), with properties as indicated below:
 Article ID: CSN-10
 EAN 7640155431576
 Material NdFeB
 Pot diameter D 10 mm
 Total height H 4.5 mm
 Borehole d1 3 mm
 Countersinking d2 4.8 mm
 Countersinking t 0.9 mm
 Tolerance+/−0.1 mm
 Coating Nickel-plated (Ni—Cu—Ni)
 Steel Q235 (China)
 Magnetisation N38
 Strength approx. 1.3 kg (approx. 12.7 N)
 Max. working temperature 80° C.
 Weight 2,0000 g A graphic of the force (expressed in kilogram) between the magnet and a sheet of steel or iron in function of the distance between the sheet and the magnet is given in https://www.supermagnete.be/eng/pot-magnets-with-countersunk-borehole/countersunk-pot-magnet-10 mm_CSN-10. This is representative of the force exerted between such a magnet and the support structure 400. This magnet in a steel pot has a countersunk borehole and can be fastened with a countersunk screw. It is suitable for mounting solutions in the shopfitting and lighting industries as well as for household use.

Using several magnets fastened to the intermediary support element 500 that support a display tile, an attractive force of +/−100 N keeps the intermediary support element pressed against the support structure 400 in Zincor (the intermediary support element 500 is "sandwiched" between the magnets and the support structure 400). With typical materials used for the intermediary support element 500, the friction forces that oppose or restrict movement of the intermediary support element 500 in the plane of the support structure 400, are in the range of 20 to 50 N which is well within the range of forces that a manipulator (whether human or robot) can exert without problem. Once the intermediary support element 500 and the associated display tile are at their nominal position, bolts, like bolt 700, are used to fasten the intermediary support element 500 and the associated display tile to the support structure.

Figure 8A:
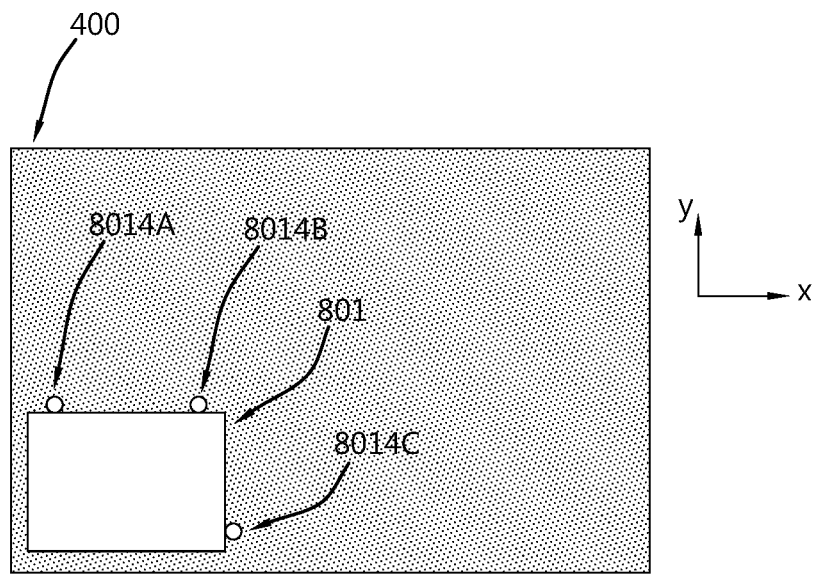
FIGS. 8*a*, 8*b*, 8*c*, 8*d*, 8*e* and 8*f* show an example of steps to assemble a tiled display in accordance with an embodiment of the present invention.

Alternatively or in combination with magnets on the element 500, magnets (like 603) can be distributed across the back surface 602 of the display tile 600. As in the example of FIG. 6, magnets (like 603) are distributed along the edges of the back surface 602. Referring to FIG. 8a, a first tile 801 is fastened to the support structure 400 by means of its associated intermediary support structure and fastening means 8014A, 8014B and 8014C. The fastening means 8014A, 8014B and 8014C can be part of a suitably shaped device such as a rectangular shaped device (e.g. shown FIGS. 24-29), T-shaped device, or Y-shaped device like the one illustrated on FIG. 5. Each of the fastening means 8014A, 8014B and 8014C can be located on one extremity of the three extremities of the T- or Y-shaped device or on any side of the rectangular shaped device as shown, for example, in FIGS. 24-29.

Figure 8B:
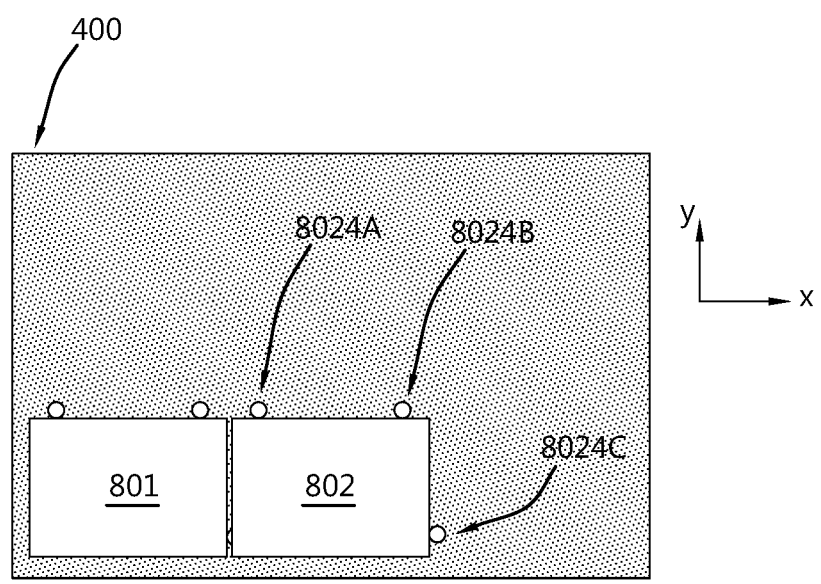

A second tile 802 is then placed next to the first tile. The tile 802 is placed, for example, to the right of tile 801. When the second tile 802 is in its nominal position, the fastening means 8014C associated with tile 801 is under the tile 802, but the fastening means 8024A, 8024B and 8024C associated with the tile 802 are still accessible to introduce a bolt and fasten the tile 802 to the support structure 400. This is illustrated on FIG. 8b. The openings in the support structure 400 to receive bolts are not shown.

Figure 8C:
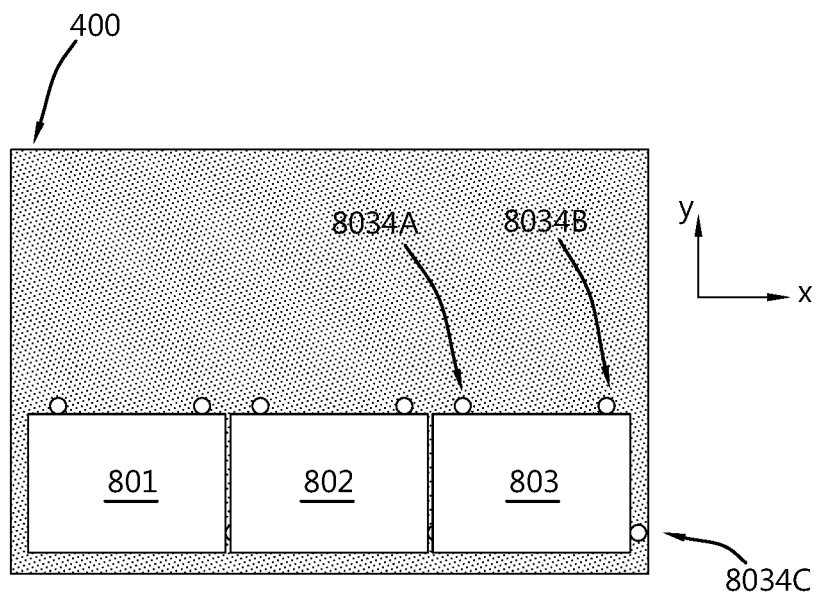

A third tile 803 is then placed next to the second tile 802. In the example of FIG. 8c, the tile 803 is placed to the right of tile 802. When the third tile 803 is in its nominal position, the fastening means 8024C associated with tile 802 is under the tile 803 but the fastening means 8034A, 8034B and 8034C associated with the tile 803 are still accessible to introduce a bolt and fasten the tile 803 to the support structure 400.

Figure 8D:
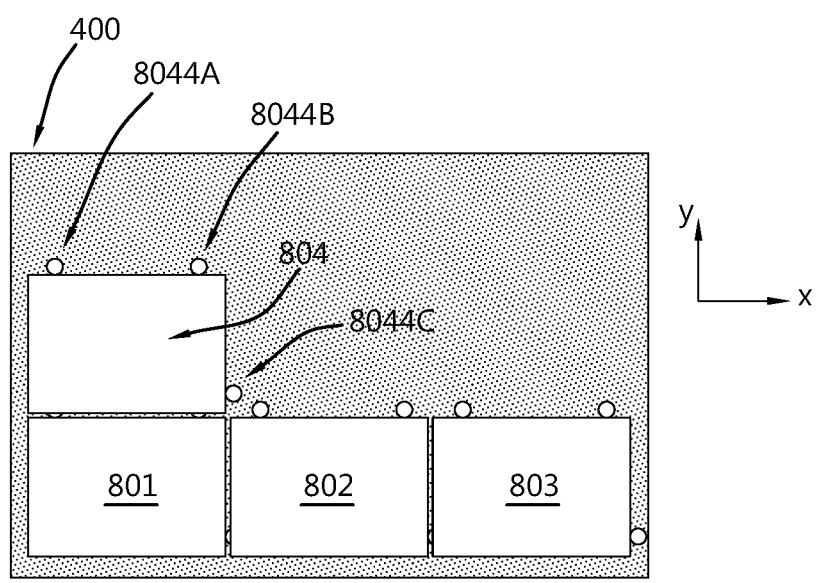

A fourth tile 804 can be placed above the first tile 801 as illustrated on FIG. 8d. When the fourth tile 804 is in its nominal position, the fastening means 8014A and 8014B are under the fourth tile 804 but the fastening means 8044A, 8044B and 8044C associated with the fourth tile 804 are still accessible to introduce bolts and fasten the tile 804 to the support structure.

Figure 8E:
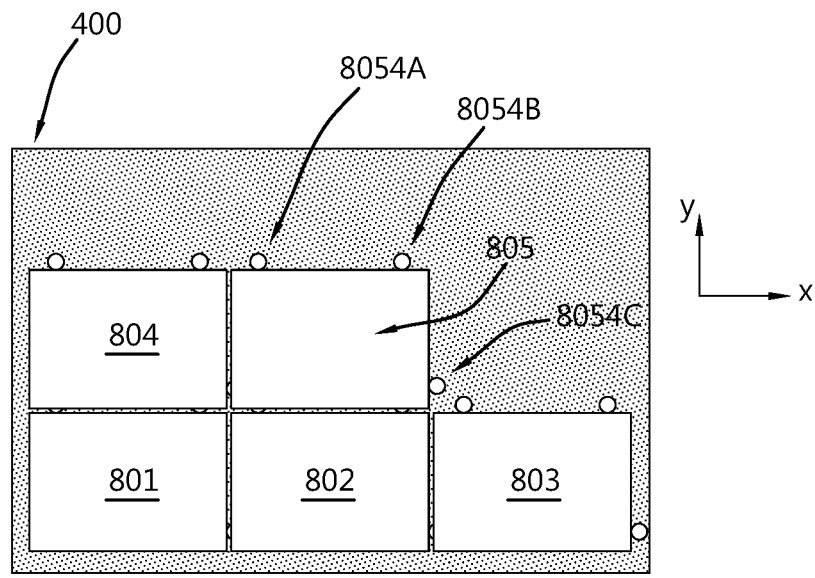

A fifth tile 805 can be placed to the right of the fourth tile 804 and above the second tile 802 as illustrated on FIG. 8e. When the fifth tile 805 is in its nominal position, the fastening means 8044C associated with the fourth tile 804 and the fastening means 8024A and 8024B associated with the second tile 802 are under the fifth tile 805, but the fastening means 8054A, 8054B and 8054C associated with the fifth tile 805 are still accessible and the fifth tile 805 can be fastened to the support structure 400. This illustrated on FIG. 8e.

The assembly of the tiled display can be pursued by adding tiles. In this example, the fastening means associated with a display tile are distributed on its top side and right side and, therefore, the assembly is done by assembling tiles from above and or the right of display tiles already fastened to the support structure.

Disassembling the tiled display can be done, in the example just given, from the top right corner and will be done towards the left and the bottom side of the assembly, one row at a time.

Figure 8F:
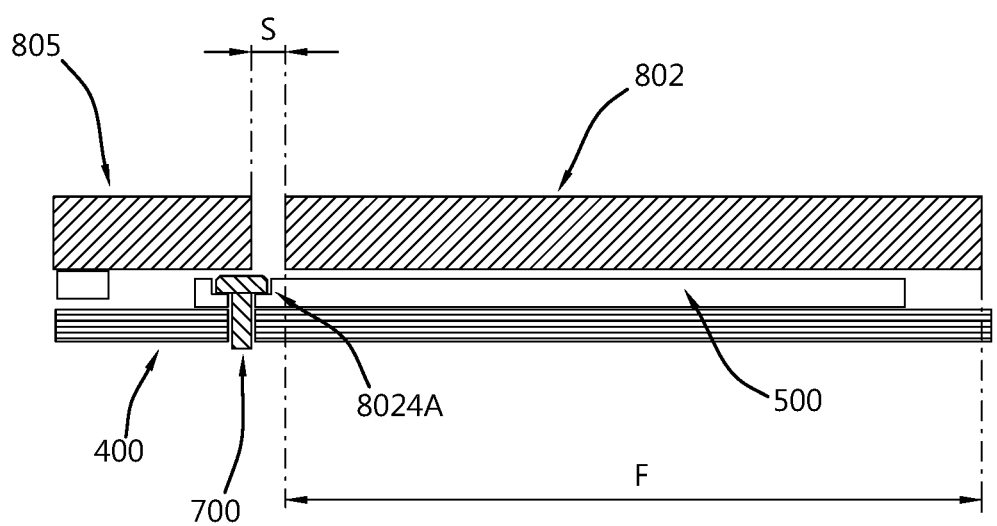
Figure 9A:
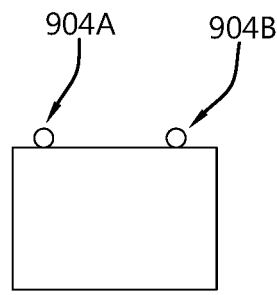
FIGS. 9*a*, 9*b*, 9*c*, 9*d* show how fastening means can be distributed along a single side of the display tile.
Figure 9B:
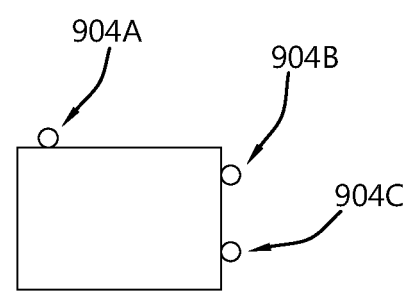
Figure 9C:
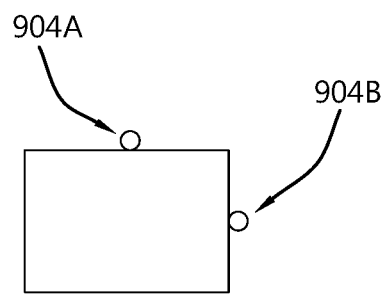
Figure 9D:
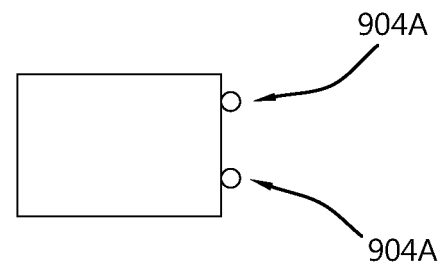

It is an advantage of this embodiment of the invention that no complex mechanism is required to access the fastening means during assembly of the tiled display from a front surface of the tiled display device, even though the fastening means are larger than the distance between two adjacent display tiles. FIG. 8f shows a cross section of the tiled display along a direction parallel to the axis Y of the tiled display that shows the position and dimensions of the fastening means, like 8024A, relative to the footprint F of the display tile 802 and the seam S between the display tiles 802 and 805. FIG. 8f emphasizes the fact that the fastening means 8024A:

Are outside of the footprint F of the display tile 802; and
Cannot be accessed through the seam S that exists between the adjacent display tiles 802 and 805.

Accessing the fastening means 8024A from a front side of the display is done either before the adjacent display tile 805 is fastened to the support structure 400 or after the display tile has been removed.

Alternatively, a defective display tile 600 can be removed from its associated intermediary support element 500 by means of one or more actuators in the display tile and/or in the intermediary support structure 500. The one or more actuators can be controlled by means of the same interface that is used to transmit data and control signals to a display tile or by separate means: using, for example, a wireless communication system such as an NFC connection, a Bluetooth connection, WiFi connection or a simple FM signal or a magnetic signal, positioning a magnet at a specific place. For instance, if a pin and hole combination(s) is used to attach the display tile 600 to the intermediate support structure 500, a linear actuator at the back of the display tile can, when activated, trigger the release of the pin and hole combination(s). In that case, all the other display tiles and the corresponding intermediary support element remain in place. The position of the new display tile replacing the defective display tile is already determined by the pin and hole combination(s) used to fasten the new display tile to the intermediary support structure.

The same advantages as described above can be obtained if the fastening means are distributed along a single side of the display tile as illustrated on FIGS. 9a, 9b, 9c and 9d. This is the case with a Y-shaped, T-shaped or rectangular shaped intermediary support structure.

Figure 10:
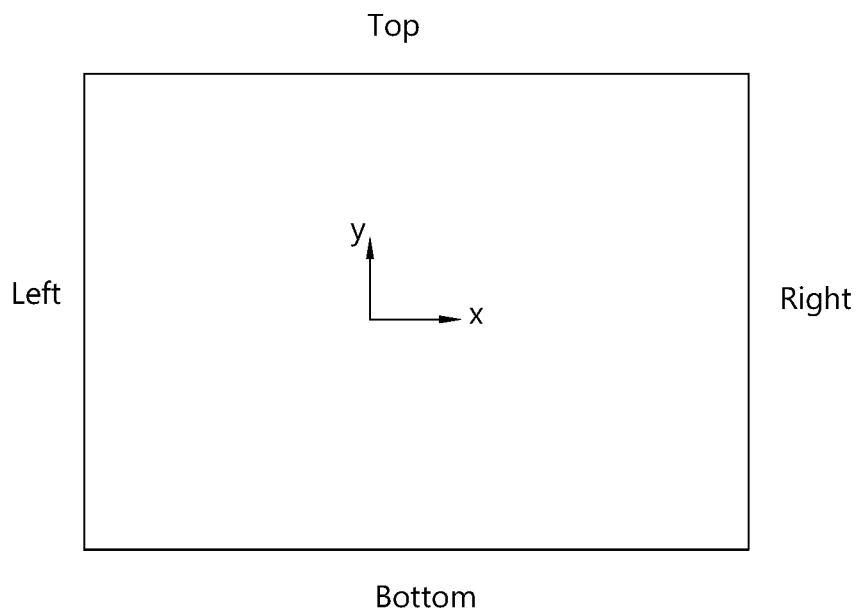
FIG. 10 shows the relative positions of the side that are identified as "top", "bottom", "left" and "right".

A display tile can be rectangular, for example an oblong or a square. The fastening means used to fasten the display tile to the support structure are either on a single side of the display tile or are distributed along two abutting sides. If two abutting sides are used, they are for instance: (left, top), (top, right) as in the examples of FIGS. 8a to 8e, (right, bottom) and (bottom, left). The relative positions of the top, right, bottom and left sides are seen on FIG. 10.

Figure 11:
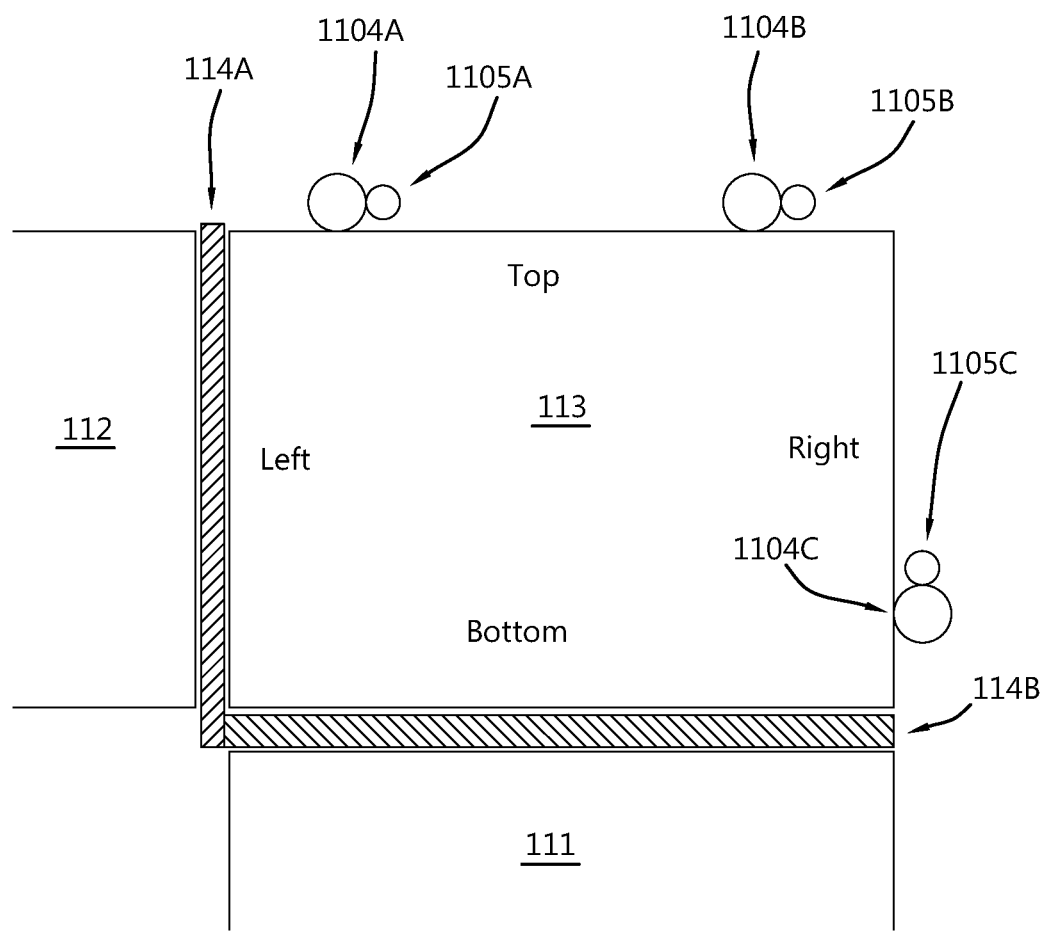
FIG. 11 shows how spacers can be used to help with the alignment according to an embodiment of the present invention.

In a further aspect of the invention, the alignment of adjacent display tiles can be done for example with the help of a spacer as illustrated on FIG. 11.

In its simplest form a spacer like 114a and 114b can be made of, for example, hard rubber with a thickness equal to the nominal seam between adjacent display tiles 112 and 113 and between adjacent display tiles 111 and 113. The spacers 114a and 114b can be attached to each other and form a right angle. The thickness Th of the spacer is equal to the nominal distance between adjacent display tiles.

To manipulate a display tile without having to contact its display surface, a tool can be fastened to the intermediary support structure by means of fastening means like 1105A, 1105B, 1105C on FIGS. 11 and 505A, 505B, 505C on FIG. 5. The fastening means 1105A, 1105B, 1105C shown on FIG. 11 and fastening means 505A, 505B, 505C on FIG. 5 or FIG. 6 can be part of a Y-shaped or T-shaped or rectangular shaped intermediary support structure which can include means for fastening to a support structure, namely, for example, openings 504A, 504B and 504C and fastening means 1104A, 1104B and 1104C. In the embodiments shown in FIGS. 14-28, such coupling means or holes 505A, 505B, 505C, 1505A, 1505B and 1505C may be present in the intermediary support structure for use with a tool but can also be left out.

The fastening means for fastening to the tool can be distributed along the same side or sides as the fastening means for fastening to the support structure. The number and disposition of fastening means for fastening to the tool can be identical to the number and disposition of fastening means for fastening to the support structure as illustrated on e.g. FIGS. 5 and 11.

The tool can be mere handles that allow manipulation of the display tile by a human agent without contact with the display surface. The fact that the tool is fastened to the intermediary support element and the display tile at the same positions as the fastening means for fastening to the support structure mean that the display tile can be positioned and fastened to the support structure at its nominal position without impediment by the tool, even if the dimensions of the fastening means for fastening to the tool are larger than the size of the seam.

Alternatively, the positioning of the display tiles can be automated. A display tile fastened to the tool is translated and/or rotated by means of one or more motors and the relative position of the display tile with respect to one or two adjacent tiles is monitored by one or more sensor(s).

The sensor can be an optical camera or image sensor. Alternatively, the sensor can be any sensor that can evaluate the distance between adjacent display tiles.

The distance between adjacent display tiles can be evaluated on the basis of the position of adjacent corners of adjacent display tiles.

Figure 12:
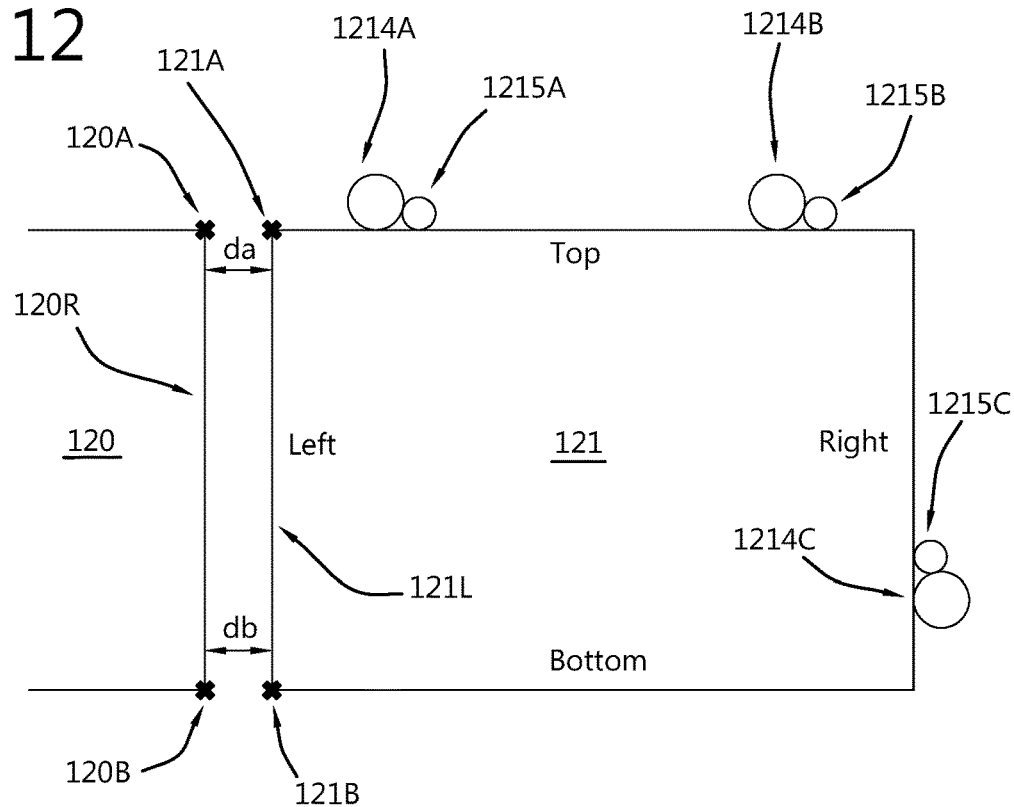
FIG. 12 shows examples of the parameters than can be used to evaluate the alignment of a display tile with a single adjacent display tile as used with embodiments of the present invention.

In the example of FIG. 12, the alignment of display tile 121 with respect to display tile 120 can be evaluated by:

The distance db between the bottom left corner 121b of display tile 121 and the bottom right corner 120b of display tile 120; and The distance da between the top left corner 121a of display tile 121 and the top right corner 120a of display tile 120.

If the distances da and db are different, then the right side 120R of display tile 120 cannot be parallel to the left side 121L of display tile 121. If the sides 120R and 120L are not parallel, a person or a motor can rotate the display tile by, for example, applying a torque to the display tile by the intermediary of the tool fastened to the display tile 121 by means of the fastening means 1215A, 1215B and 1215C.

If both distances da and db are equal but different from a nominal distance d0, the display tile 121 can be translated by the intermediary of the tool. In the embodiments shown in FIGS. 14-28, coupling means or holes 1215A, 1215B and 1215C may be present in the intermediary support structure for use with a tool but can also be left out.

Once the two tiles are aligned, the display tile 121 can be fastened to the support structure with the fastening means 1214A, 1214B and 1214C as was described earlier.

Figure 13:
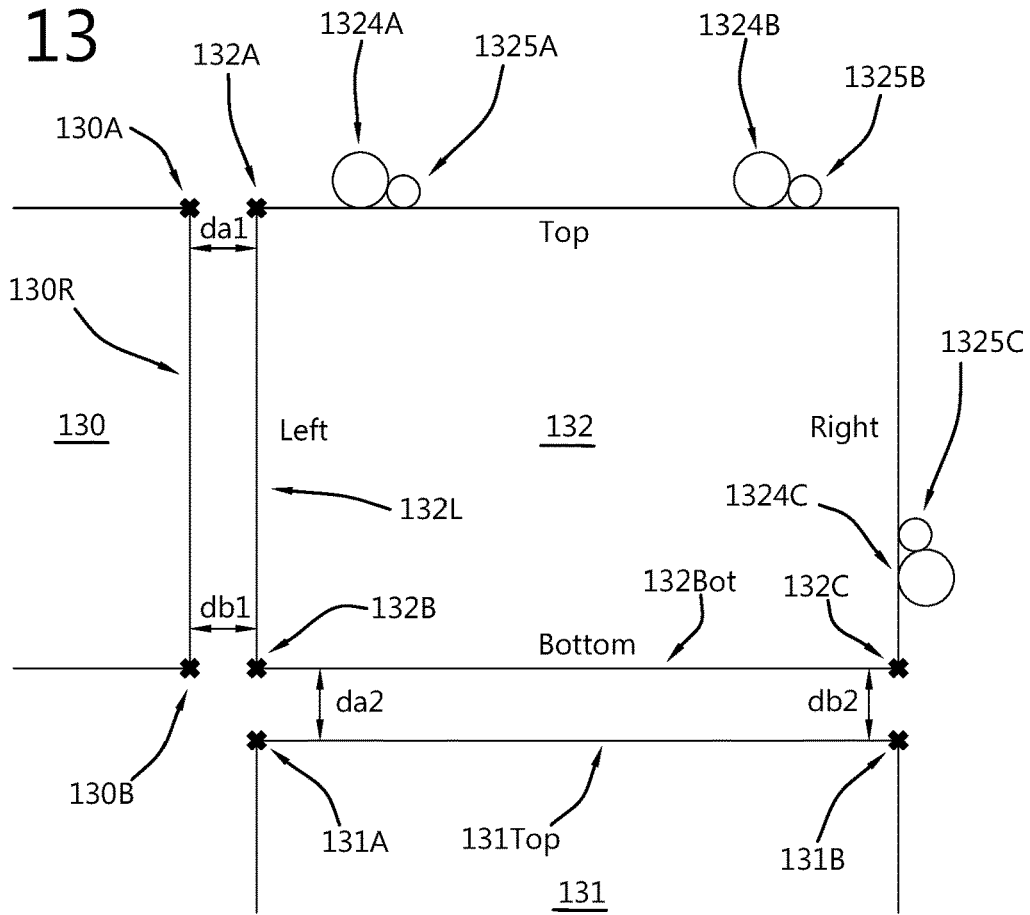
FIG. 13 shows examples of the parameters than can be used to evaluate the alignment of a display tile with two adjacent display tiles when used with the present invention.

As illustrated on FIG. 13, the alignment of a display tile 132 can be made by monitoring the relative positions of three of its corners (132a, 132b, 133c) with respect to the corners of display tile 130 (corners 130a and 130b on the right side of the display tile 130) and/or of display tile 131 (corners 131a and 131b on the top side of display tile 131). In the embodiments shown in FIGS. 14-28, coupling means or holes 1325A, 11325B and 1325C may be present in the intermediary support structure for use with a tool but can also be left out.

Similarly, to what was described with the help of FIG. 12, the distances between corners of tile 130 and the corresponding corners of tile 132 can be evaluated as well as the distance between corners of tile 132 and the corresponding corners of tile 131:

The distance db1 between the bottom left corner 132b of display tile 132 and the bottom right corner 130b of display tile 130; and The distance da1 between the top left corner 132a of display tile 132 and the top right corner 130a of display tile 130.

The distance da2 between the top left corner 131a of display tile 131 and the bottom left corner 132b of display tile 132; and The distance db2 between the top right corner 131b of display tile 131 and the bottom right corner 132c of display tile 132.

If the right side 130R of display tile 130 is parallel to the left side 132L of display tile 132, then the distances da1 and db1 are equal.

If the top side 131Top of display tile 131 is parallel to the bottom side 132Bot of display tile 132, then the distances da2 and db2 are equal.

If these conditions are not met, the display tile 132 must be rotated.

Additionally, if the distances da1, da2, db1 and db2 are all equal but differ from their nominal value (the nominal value being the value when the seam is as expected), it is necessary to translate the display tile 132.

For embodiments of the invention wherein the display tile and the intermediary support structure are attached to one another by means of pins and holes, if one of the tiles is damaged, it can be extracted while leaving the intermediary support structure fastened to the support structure. The tile and the intermediary support element being manufactured with a higher precision than the support structure, a new tile can be attached to said intermediary support element without having to adjust the alignment of the tiles.

A tool can be used to manipulate a display tile without coming into contact with the display surface of the display tile, while aligning that display tile with one or more adjacent display tiles. In the embodiments shown in FIGS. 14-28, such a tool can be used but this does not have to be the case.

Trusses arching over the display surfaces can interact with the fastening means like disposed around one or two abutting sides of the display tile. Two and preferably three sensors (in particular, the sensors are image sensors) are fastened to the tool so as to have the corners of the display tile in their respective field of view. The corners to be monitored are the corners which will be closest to the display tiles already fastened to the support structure (for example 400) with which the display tile will be aligned. For instance, if the means for fastening to the support structure are along the top and right side of the display tile, the cameras have in their field of view the top left corner, the bottom left corner and the bottom right corner, respectively. In general, the corners that are used to evaluate the seam (or the distance between display tiles) are those corners that are part of the sides where there are no fastening means for fastening to the support structure and no fastening means for fastening to the tool.

The tool can be fastened to e.g. an XY+rotation motorized gantry mechanism. The motors of the gantry mechanism are controlled by controlling means (such as, for example, a microcontroller) that uses the reading of the sensors to determine how the motors must be driven to bring the readings to their desired value.

The distances da1, da2 can be derived in any way known to the art. In particular, when the sensors are cameras, ad-hoc image processing is used to determine the distances.

The distances can be derived from images taken by the image sensor by, for example, counting the number of pixels that separate specific points indicated on the surface of the display tiles in the vicinity of the corners on each display tile. For instance, one pixel at the apex of each corner can be flashed on and off to facilitate its identification (by subtracting two consecutive images and thresholding, only the flashing pixels will be left).

Display tiles are typically loaded (placed) into a structure for a tiled display in a direction perpendicular to the plane of the tiled display (Z direction). As the distance between these modules is very small and as the display tiles have fragile edges, it often happens that display tiles get damaged during installation of a display tile in the tiled display.

Following this, now further embodiments of an intermediary support structure will be described. The embodiments provide a simple and reliable installation of display tiles in a tiled display while at the same time ensuring a strong reduction of the risk of damaging the display tiles during installation. This is due, amongst others, to the fact that it enables a more controlled installation of the display tile along a specific path compared to, for example, display tiles which are not guided and which can be freely moved during their installation. The simplicity of these embodiments allows a less trained person to install display tiles in the tiled display. It also increases the speed at which display tiles can be installed without, however, reducing the accuracy with which the display tiles are positioned in their final position of operation.

These embodiments will be described by means of FIGS. 14 to 27.

Figure 14:
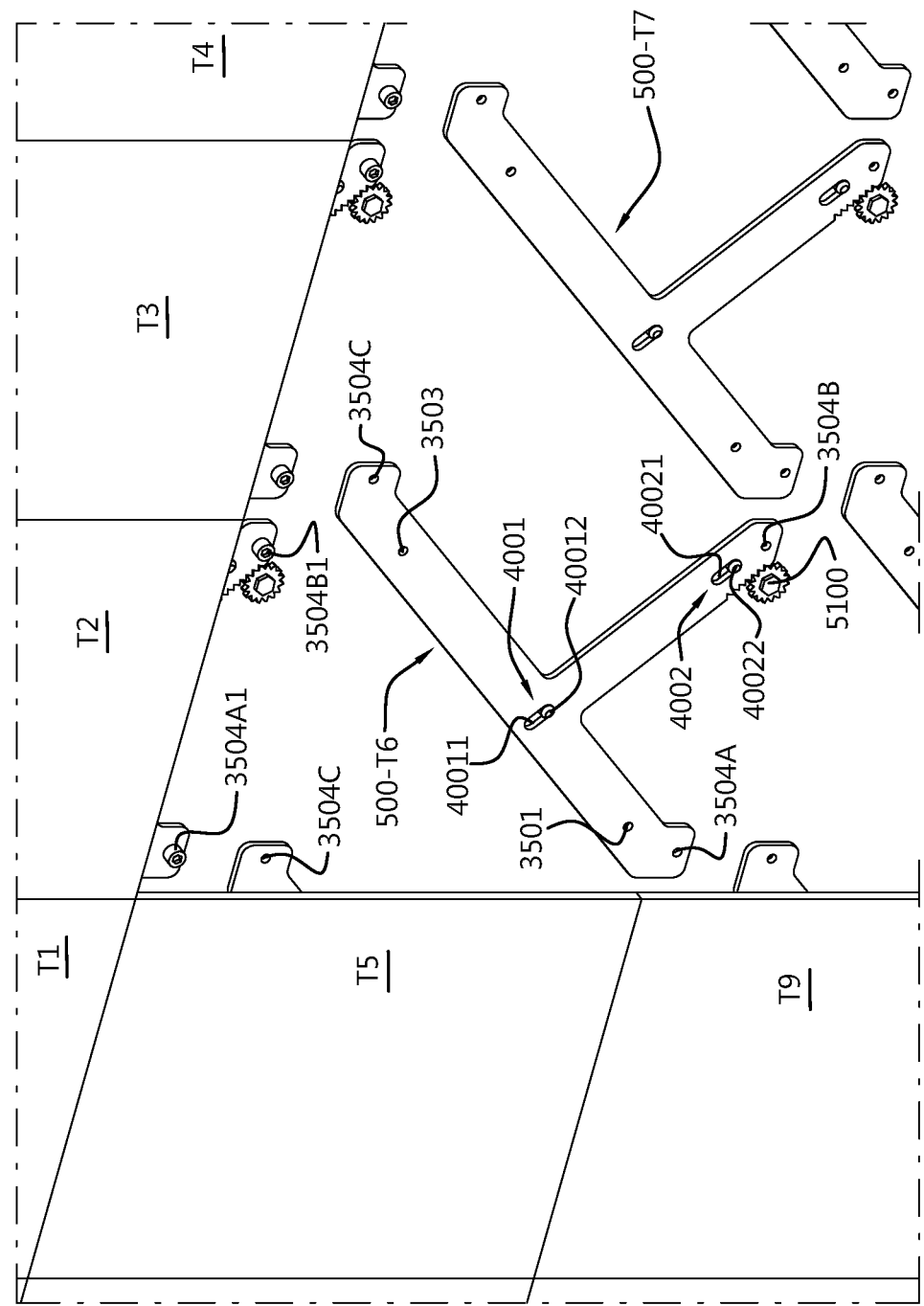
FIG. 14 shows an example of a tiled display in another embodiment in which a number of display tiles are already in their operative position in the tiled display and in which a number of intermediary support structures are visible either completely (500-T6, 500-T7) or partly.

FIG. 14 shows an example of a tiled display in which a number of display tiles (T1-T5, T9) are already installed in their position of operation, i.e. operative position, in the tiled display and in which a number of intermediary support structures are visible either completely (500-T6, 500-T7) or partly (500-T2, 500-T3, 500-T4, 500-T5, 500-T9). Display tiles T1-T5 and T9 being in their operative position are neatly aligned to one another with a nominal seam in between two adjacent display tiles. The tiled display shown as an example in FIG. 14, consists of or comprises twelve display tiles T1-T12. There could be less tiles or more tiles, e.g. two hundred, distributed in columns and rows. Display tiles T1-T5 and T9 are already installed in their final position, i.e. their respective operative position. The next display tile to be installed in the tiled display of this example is tile T6. Its matching intermediary support structure 500-T6 is, merely as an example, Y-shaped (e.g. such as in FIGS. 5 and 6). Alternatively, it can be T-shaped or rectangular shaped, e.g. as shown in FIGS. 21 to 28. Intermediary support structure 500-T6 has fastening means comprising openings 3504A, 3504B and 3504C which have the same purpose as openings 504A, 504B and 504C shown in FIGS. 5 and 6, namely for use in fastening intermediary support structure to a support structure 400, such as a wall. There can be one such opening or two or three such openings (as shown in FIGS. 5, 6 and 14) or more. Such openings can be located at one or two or three extremities of the Y-shaped or T-shaped device (e.g. at each extremity of the horizontal head of the T-shape or in the middle of the head). One or more such openings can be located along the perimeter of a rectangular shaped intermediary support structure, inside or outside its perimeter (for example, in FIGS. 21-28 there is one opening outside the perimeter of the intermediary support structure), as long as the opening or openings remain accessible once the corresponding display tile is fastened to the intermediary support structure and before and adjacent display tile covers it. Elongate fasteners such as bolts (e.g. 3504A1 and 3504B1 in FIG. 14 in the openings 3504A and 3504B of tile T2; and of tile T6 in FIG. 20) can/will go through at least one of the openings (e.g. each one of 3504A, 3504B, 3504C) and a corresponding opening, e.g. 401, 402, 403, respectively, in the support structure 400. For example, a first elongate fastener, which will form a semi-permanent joint or a non-permanent joint such as with a bolt, can go through opening 3504A and opening 401, a second elongate fastener which will form a semi-permanent joint or a non-permanent joint, such as with a bolt 3504B1, can go through opening 3504B and opening 402 and a third elongate fastener which will form a semi-permanent joint or a non-permanent joint, such as with a bolt, which can go through opening 3504C and 403. This is like the intermediary support structure described above, amongst others with respect to FIGS. 4 to 10.

The intermediary support element 500-T6 has coupling means or fastening means for coupling or fastening to a display tile, e.g. with a non-permanent joint, for example to one or single display tile. The coupling or fastening means can be for example holes 3501, 3502, 3503 that can mate with protrusions such as pins on the display tile. Alternatively or additionally, the coupling or fastening means can be protrusions such as e.g. pins that can mate with or enter holes on the back side of the display tile. A footprint 404 of the display tile that will be coupled to the intermediary support structure, such as for example 500-T6, is indicated on FIG. 4. In the example of FIG. 14, two holes 3501 and 3503 are used. It could also be one hole/pin.

In embodiments shown in figures as from FIG. 14 onwards, an intermediary support element can be at least partially or temporarily supported by the support structure during assembly by means of a temporary fastening or fastening means such as magnets, before being fastened in place with a more permanent or semi-permanent joint, such as nuts and bolts. The temporary fastening or fastening means, such as magnets, can be glued or screwed to the intermediary support element. An advantage is that even while the weight of the display tile is supported by the support structure, it is possible to glide the intermediary support element and the display tile attached to it, into position.

Alternatively or in combination with magnets on the intermediary support structure, magnets (like 603 in FIG. 6) can be distributed across the back surface 602 of the display tile 600. As in the example of FIG. 6, magnets (like 603) are distributed along the edges of the back surface 602. Referring to FIG. 8a, a first tile is fastened to the support structure 400 by means of its associated intermediary support structure and fastening means 8014A, 8014B and 8014C (called 3504A, 3504B and 3504C in FIG. 14 and further figures). The fastening means can be part of a suitably shaped device such as a rectangular shaped device (e.g. shown FIGS. 24-28), T-shaped device, or Y-shaped device like the one illustrated on FIG. 5. Each of the fastening means can be located on one extremity of the three extremities of the T- or Y-shaped device or on any side of the rectangular shaped device as shown, for example, in FIGS. 24-28.

Figure 15:
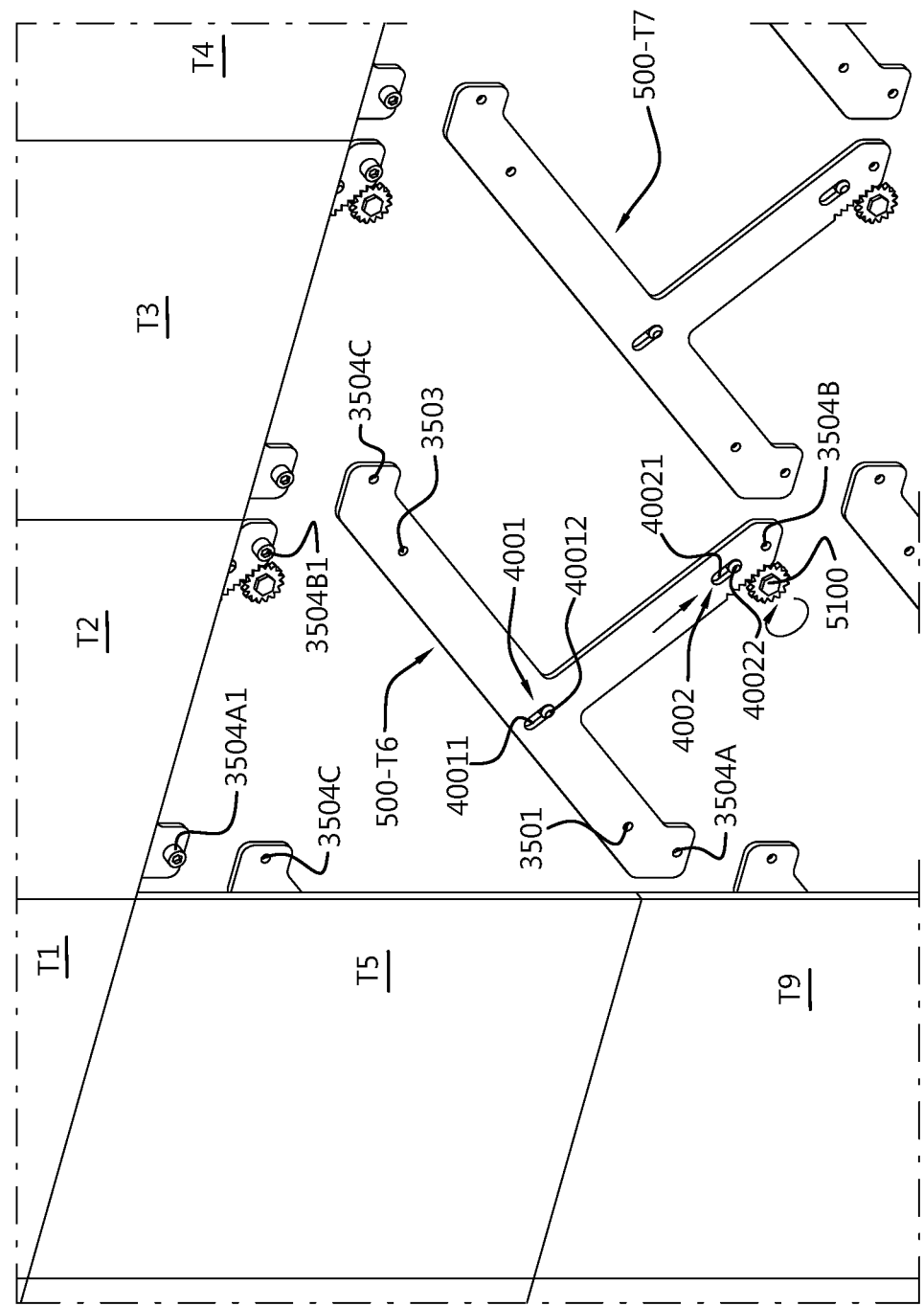
FIG. 15 shows the example of the tiled display of FIG. 14 together with the indication of the movement from a second position to a first position that the intermediary support structure 500-T6 will undergo due to the operation of an actuator, for example a rack and pinion system.
Figure 16:
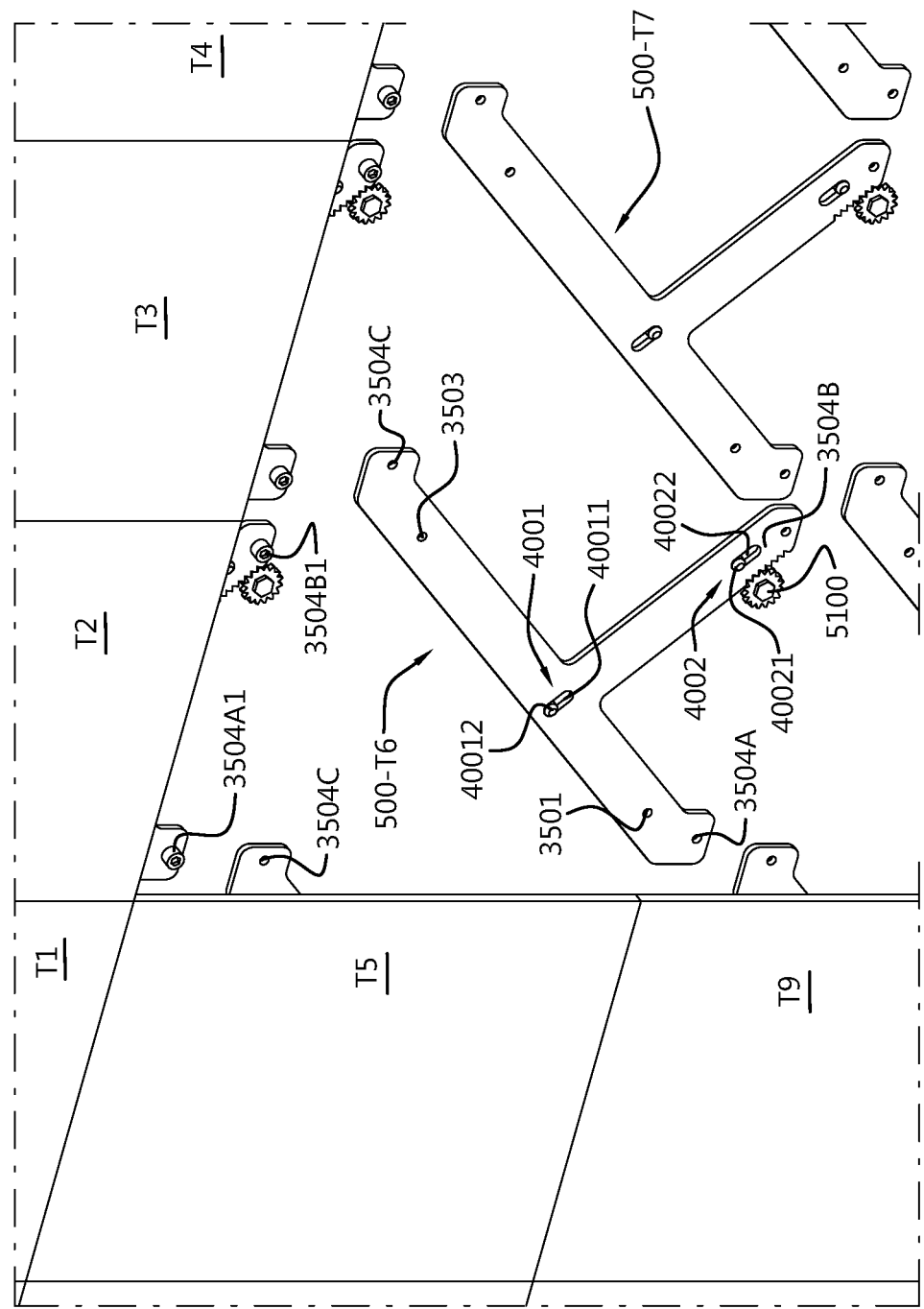
FIG. 16 shows the example of the tiled display of FIGS. 14 and 15, wherein the intermediary support structure 500-T6 is in a second position.

FIG. 15 shows an example of the tiled display of FIG. 14 together with the indication (arrow in one of the legs of the Y-shaped intermediary support structure) of the movement from the second position to a first position that the intermediary support structure 500-T6 will undergo due to the operation of an actuator, for example a linear or rotational actuator of which a rack and pinion system is one example. The first position is the position in which the distance is larger than the nominal seam between the single display tile and one or more adjacent display tiles. 9. The linear or rotational actuator is configured to be able to induce a movement from the first position to the second position. In this example, the pinion of the rack and pinion system is moved clockwise inducing a movement of the intermediary support structure 500-T6 along the rack. If the display tile is in its normal position in the XY-plane with the Z direction horizontal, this movement will be downwards. This results in the intermediary support structure being positioned in the first position as shown in FIG. 16. Alternatively, the starting position of intermediary support structure 500-T6 could be the first position, so that it does not have to be moved from the second position to the first position. Either of these possibilities are feasible and do not affect the present invention or its embodiments shown in FIGS. 14 to 28. The diagonal movement can be generated by the rack and pinion system, whereby the rack is at an angle to the horizontal which the intermediary support structure (together with the display tile when the latter is fastened to the intermediary support structure) follows. Therefore, as the pinion rotates it drives the display tile along a diagonal. The teeth of the rack can be formed in an edge of the intermediary support structure while the pinion can be journaled to the support structure or vice versa. The rack and pinion system can be self-guided or can have a separate guiding mechanism.

Figure 17:
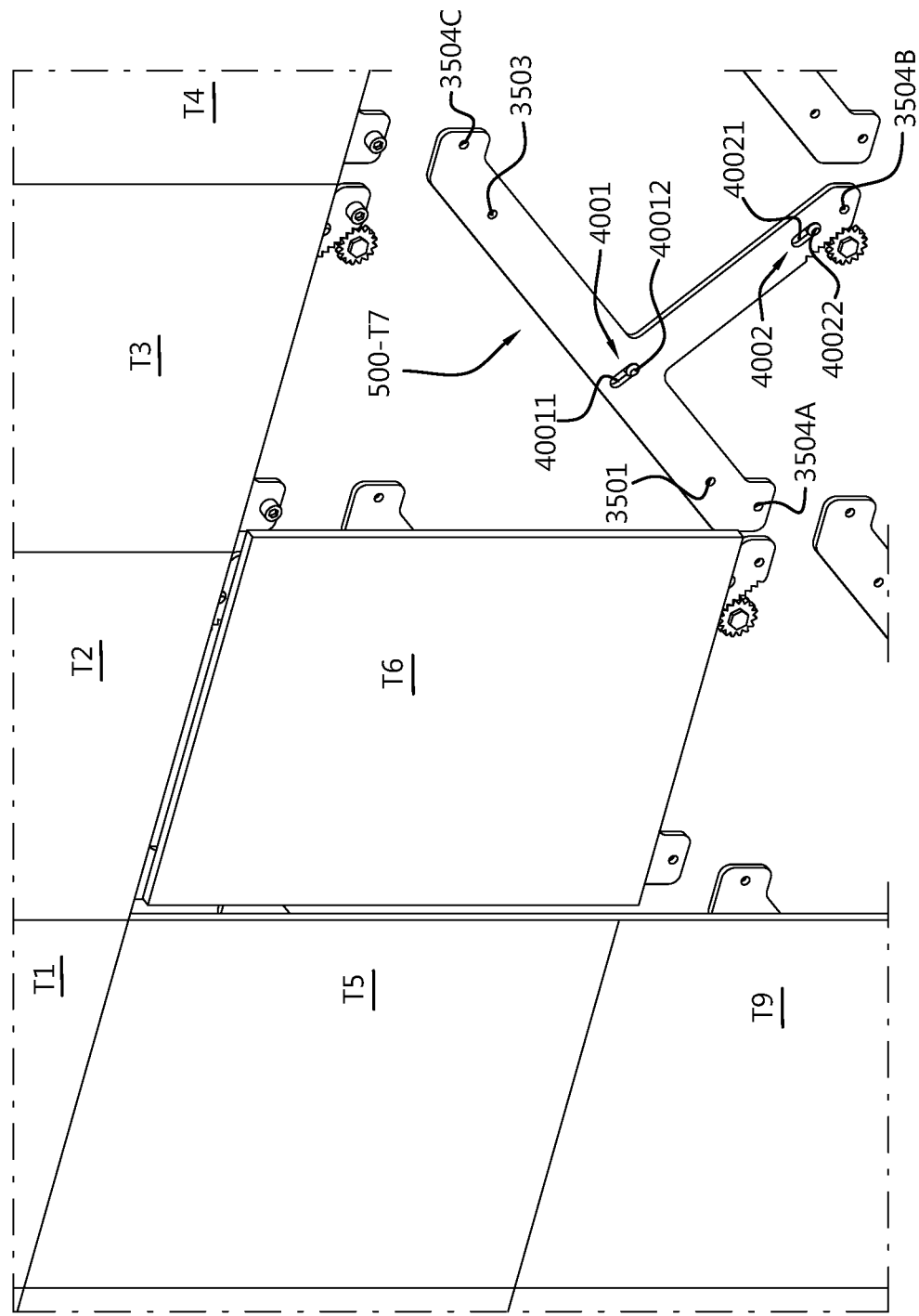
FIG. 17 shows the example of the tiled display of FIGS. 14 to 16 in which a display tile T6 is loaded on its corresponding intermediary support structure 500-T6 in the first position, whereby there is a distance D between display tile T6 and adjacent tiles T1 and T5.

FIG. 17 shows the example of the tiled display of FIGS. 14 to 16 in which a display tile T6 is loaded/placed on its corresponding intermediary support structure 500-T6 in the first position, whereby there is a distance D between display tile T6 and adjacent display tiles T1 and T5. This distance is the distance between the first position and the second position, i.e. between the loaded position of the display tile (e.g. T6) and the operative position of the display tile. Once at least one display tile is already installed, said distance is a distance between the single display tile and one or more adjacent installed display tiles, whereby the distance is between adjacent lateral edges facing each other of respectively the single display tile and of the one or more adjacent display tiles.

Typically, the display tile is loaded/placed on its corresponding intermediary support structure via a movement in the Z-direction, i.e. orthogonally to the XY-plane of the display tile (or tiled display in which the display tile is to be installed). The loading position is the position which the single display tile has during the initial placement thereof in the tiled display. Once the pins and/or holes of the intermediary support structure 500-T6 and the corresponding holes and/or pins on the back surface 602 of display tile T6 are mated, the display tile and the intermediary support structure 500-T6 behave like a solid (single) body, i.e. they form a module, whereby the relative position of display tile T6 and the intermediary support structure 500-T6 with respect to each other is fixed while moving from the first position to the second position.

Figure 18:
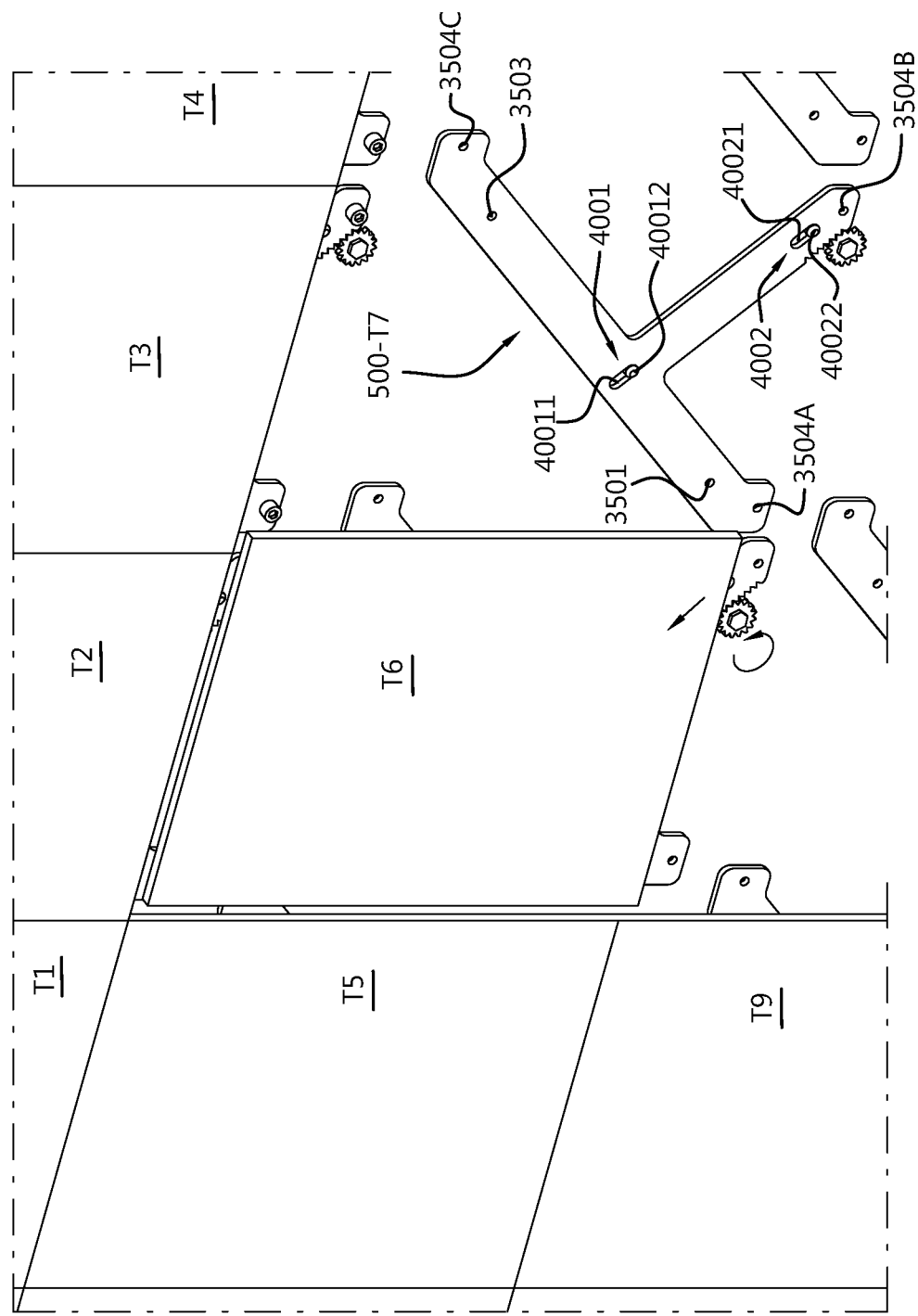
FIG. 18 shows the example of the tiled display of FIGS. 14 to 17 in which display tile T6 with its corresponding intermediary support structure 500-T6 are in the first position and with an indication that they will be moved away from the first position via the operation of an actuator, for example a rack and pinion system.
Figure 19:
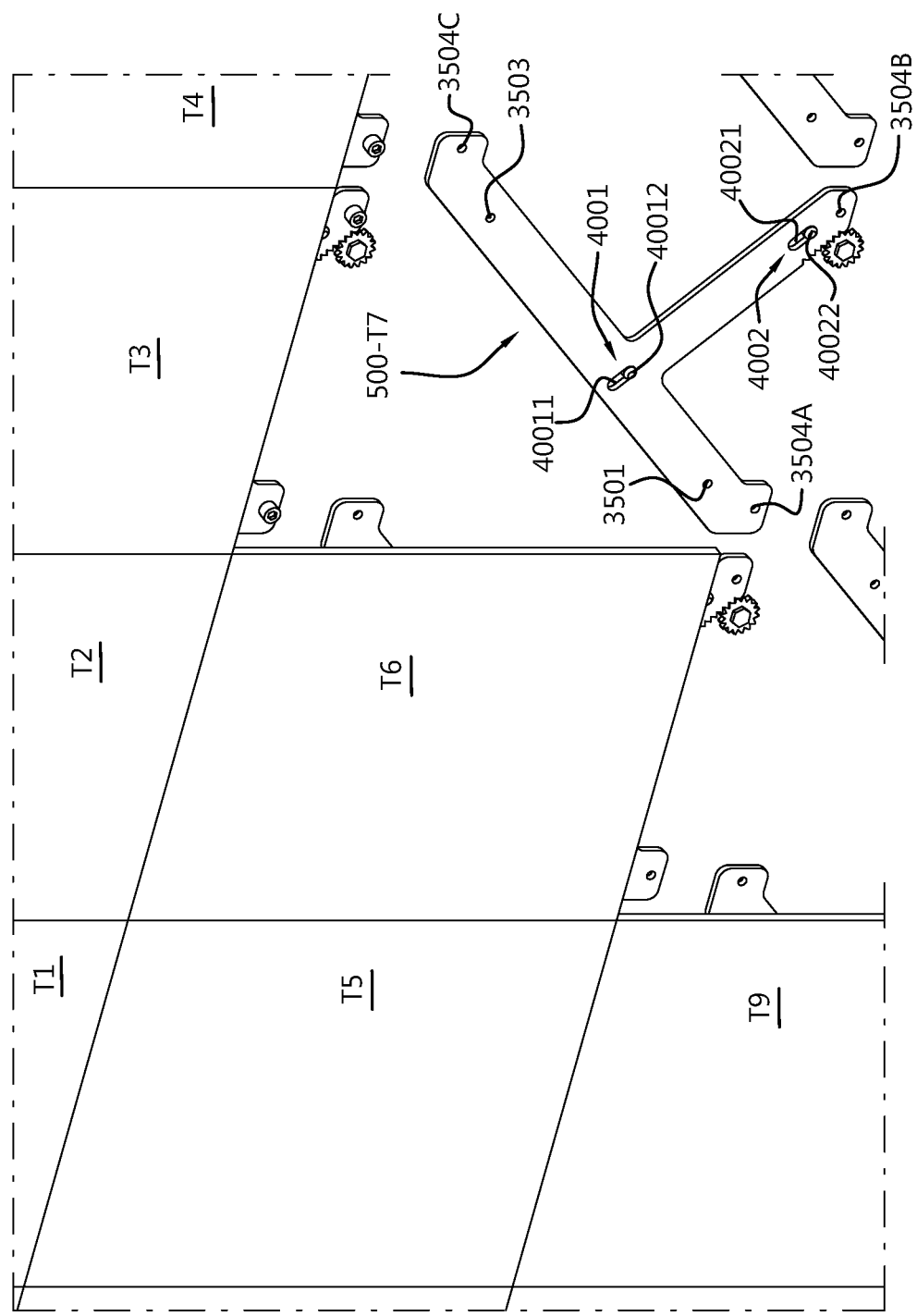
FIG. 19 shows the example of the tiled display of FIGS. 14 to 18 in which display tile T6 with its corresponding intermediary support structure 500-T6 are in the second position through the movement shown in FIG. 18.

FIG. 18 shows the example of the tiled display of FIGS. 14 to 17 in which display tile T6 with its corresponding intermediary support structure 500-T6 are in the first position and with an indication (arrow shown on bottom right part of T6) that they will be moved away from the first position via the operation of an actuator, such as a linear actuator, for example the rack and pinion system. In this example, the pinion of the rack and pinion system will move counter-clockwise inducing a movement of the intermediary support structure 500-T6 upwards along the rack. This results in tile T6 together with its intermediary support structure 500-T6 being moved towards and being positioned in the second position as shown in FIG. 19. The distance between the loading position of the display tile and the operative position of the display tile becomes equal to the seam between the single display tile and the one or more adjacent display tiles when the single display tile has reached the second position.

The operation of the rack and pinion system may be guided by a guide element 4001. The guide element may be linear. The guide element 4001 can include a slot 40011 and a pin 40012 in which the pin runs and is constrained to make the intermediary support structure follow a predetermined path. The predetermined path can be a diagonal one, i.e. a path at an angle with the Y-axis within a plane parallel to the XY-plane of the corresponding display tile. Said angle can be, for example 45°, or can be between 400 and 500 or between 30° and 60°, in order to reduce the risk of damaging the display tile. The pin in the slot may also move along a predetermined path, e.g. a diagonal path. The slot 40011 can be in the intermediary support structure and the pin 40012 may be attached to the support structure or vice versa. In order to increase the stability of the intermediary support structure two guide elements 4001 and 4002 can be used. In FIG. 14, these are shown as slots 40011 and 40021 and pins 40012 and 40022 arranged at each end of a diagonal across the intermediary support structure, here for example at each end of one of the legs of the Y-shaped intermediary support structure. The movement along the predetermined path generated by the linear or rotational actuator is controlled by a linear guide.

The single display tile and the intermediary support structure can be a module configured to behave as a single body, whereby the relative position of the single display tile and the intermediary support structure with respect to each other is fixed in any position on the predetermined path.

Figure 20:
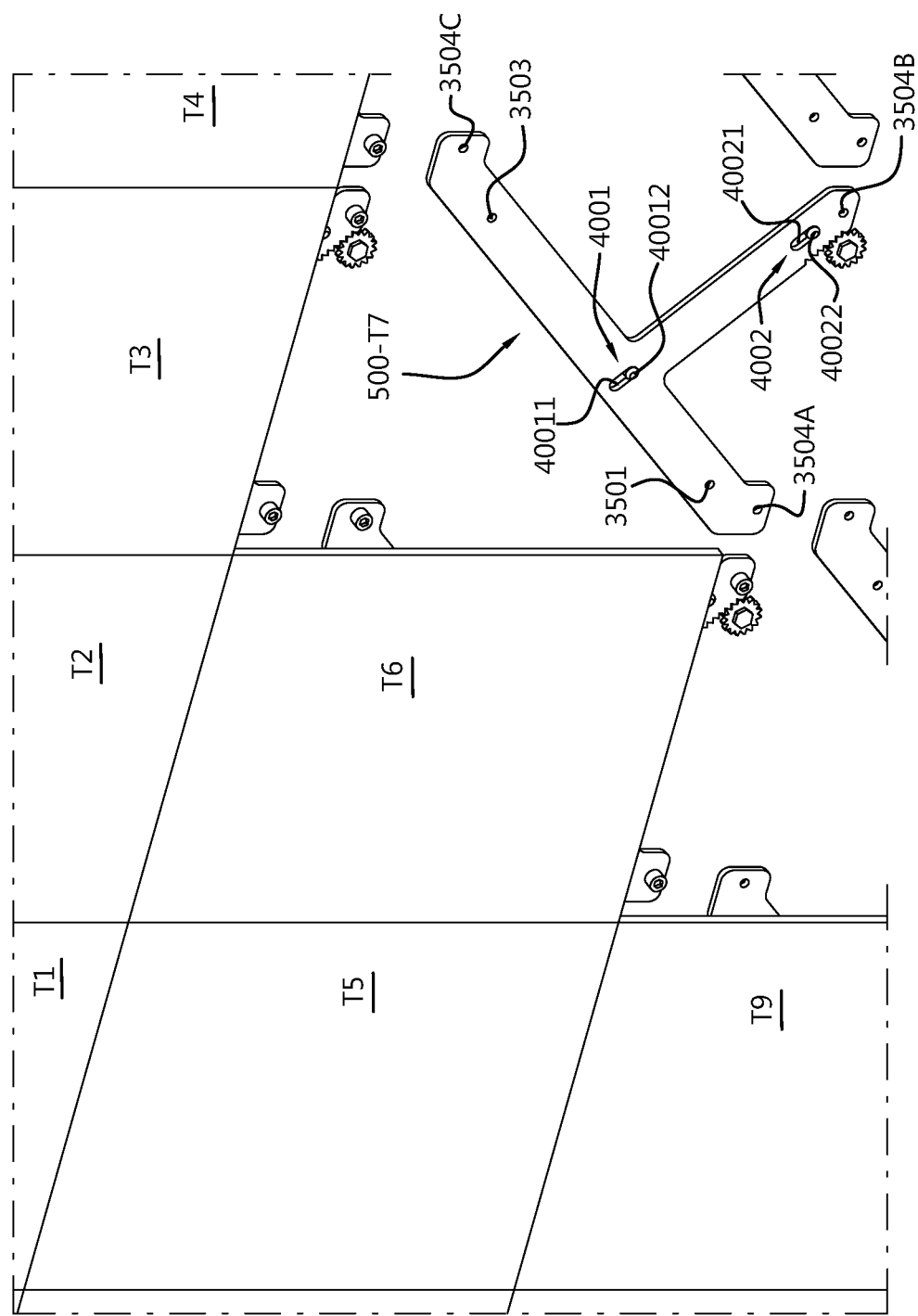
FIG. 20 shows the example of FIG. 19 in which the intermediary support structure 500-T6 is fastened to the support structure.

Once the display tile is installed in the second position, i.e. its operative position, as shown in FIG. 19, the intermediary support structure 500-T6 can be fastened to the support structure, as shown in FIG. 20. This can be done by means, for example, of elongate fasteners or fastening means such as bolts 3504A1, 3504B1 and 3504C1 in respectively the openings 3504A, 3504B and 3504C of intermediary support structure 500-T6. The fasteners go through each at least one of the openings 3504A, 3504B, 3504C and a corresponding opening, e.g. 401, 402, 403, respectively, in the support structure 400. The bolt can have an external screw thread which can be secured in a nut or a screw thread in a hole in the support structure. In FIG. 20, one can see that the linear or rotational actuator is accessible outside a perimeter or footprint of the single display tile and remains accessible in positions along the predetermined path (FIGS. 14 to 20) and remains accessible until an adjacent display tile is covering an access to the actuator. FIGS. 21a and 21b show another example of an intermediary support structure. Both these drawings show an alternative of the intermediary support structure shown in FIGS. 14-20. It is mainly rectangular in shape. This is a simplified version compared to other embodiments such as the ones shown in FIGS. 24-28). An opening or openings 3504A, 3504B and 3504C in this intermediary support structure can be located along the perimeter of the intermediary support structure, inside or outside its perimeter (see e.g. FIGS. 24-28), as long as the opening or openings remain accessible once the corresponding display tile is fastened to the intermediary support structure and before an adjacent display tile covers it (as can be seen, for example in FIG. 27), with display tile T7 covering the fastening means (elongate member or bolt 3504B1 in opening 3504B) of tile T3.

Moreover, in FIGS. 21a and 21b another example of an actuator is shown, namely a rotational cam 5200. Such an actuator can be used also when the intermediary support structure has another shape, e.g. a Y-shape or a T-shape. The movement along the path extending from the first position to the second position can be generated by the rotational cam 5200 whereby the intermediary support structure is configured as a cam follower and whereby the rotational cam 5200 drives the intermediary support structure along a diagonal path when the rotational cam is rotated as the intermediary support structure follows a guide element 4003. The guide element can include a slot 40031 and a pin 40032 in which the pin runs and is constrained to make the intermediary support structure follow a diagonal path. The slot can be in the intermediary support structure and the pin may be attached to the support structure or vice versa. In order to increase the stability of the intermediary support structure two guide elements 4003 and 4004 can be used. In FIGS. 21a and 21b these are shown as slots 40031 and 40041 and pins 40032 and 40042 arranged at each end of a diagonal across the intermediary support structure. FIG. 21a shows the intermediate support structure in the first position and FIG. 21b shows the intermediate support structure in the second position.

FIGS. 22a and 22b show another example of an intermediary support structure. In these drawings an alternative of the intermediary support structure shown in FIGS. 14-20 is shown. It is mainly rectangular. This is a simplified version compared to other embodiments such as the ones shown in FIGS. 24-28). An opening or openings 3504A, 3504B and 3504C in this intermediary support structure can be located along the perimeter of the intermediary support structure, inside or outside its perimeter (see e.g. FIGS. 24-28), as long as the opening or openings remain accessible once the corresponding display tile is fastened to the intermediary support structure and before an adjacent display tile covers it (as can be seen, for example, with display tile T7 covering the fastening means (elongate member or bolt 3504B1 in opening 3504B) of tile T3.

Opening or openings 3504A, 3504B and 3504C could also be located in a part as shown in particular in FIGS. 24-28, which part will also remain accessible once the corresponding display tile is fastened to the intermediary support structure.

Moreover, another example of an actuator 5300 is shown, such as an articulated lever lying in a plane. The movement along the diagonal path extending from the first position to the second position can be generated by the articulated lever lying in the XY plane, preferably in combination with a guide element 4003. The guide element 4003 can include a slot 40031 and a pin 40032 in which the pin 40032 runs and is constrained to make the intermediary support structure follow a diagonal path. The slot 40031 can be in the intermediary support structure and the pin 40032 may be attached to the support structure or vice versa. In order to increase the stability of the intermediary support structure two guides elements 4003 and 4004 can be used.

In FIGS. 22a and b these are shown as slots 40031 and 40041 and pins 40032 and 40042 arranged at each end of a diagonal across the intermediary support structure.

Returning to the articulated lever, a first link 53001 of the lever 5300 is journaled to the support structure. A second link 53002 of the lever 5300 is journaled to the other end of the first link 53001. A third link 53003 of the lever 5300 is a contact element and is journaled to the second link 53002. Rotation of the first link 53001 about an axis (Z-axis) perpendicular to the XY-plane, drives the intermediary support structure via the contact element, i.e. the third link 53003, along a diagonal path. Such an actuator can be used also when the intermediary support structure has another shape, e.g. a Y-shape or a T-shape. The articulated lever can be configured to provide an over center control. This means that in the second position of the intermediary support structure the articulated lever is in a position where the third link 53003 has dropped slightly beyond top dead center of the articulated lever. Thus, to return to the first position the intermediary has to be moved slightly to get the articulated lever over and away from the top dead center position.

Figure 23A:
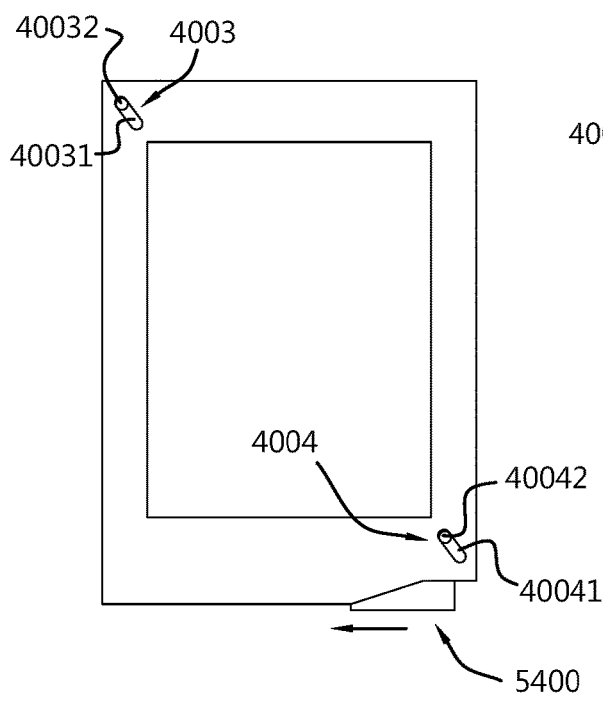
FIGS. 23a and 23b show another example of an intermediary support structure. In these drawings it is a possible alternative of the intermediary support structure shown in FIGS. 14-20. It is mainly rectangular. Moreover, another example of an actuator is shown, namely a wedge-shaped cam.
Figure 23B:
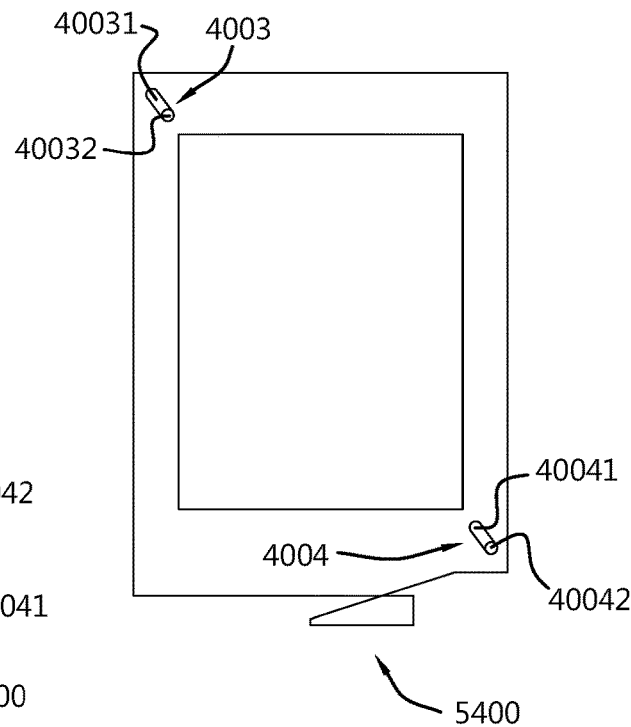

FIGS. 23a and 23b show another example of an intermediary support structure. In these drawings an alternative of the intermediary support structure shown in FIGS. 14-20 is shown. It is mainly rectangular. This is a simplified version compared to other embodiments such as the ones shown in FIGS. 24-28). An opening or openings 3504A, 3504B and 3504C in this intermediary support structure can be located along the perimeter of the intermediary support structure, inside or outside its perimeter (see e.g. FIGS. 24-28), as long as the opening or openings remain accessible once the corresponding display tile is fastened to the intermediary support structure and before an adjacent display tile covers it (as can be seen, for example, with display tile T7 covering the fastening means (elongate member or bolt 3504B1 in opening 3504B) of tile T3.

Moreover, another example of an actuator such as a linear actuator is shown, namely a wedge-shaped cam 5400. The diagonal movement along the path extending from the first position to the second position can be generated by a linear wedge-shaped cam in contact with the intermediary support structure, whereby the intermediary support is configured as a cam follower, whereby the cam drives the display tile along a diagonal when the cam is moved in a linear manner. Movement of the cam horizontally drives the intermediary support structure along a diagonal. Such an actuator can be used also when the intermediary support structure has another shape, e.g. a Y-shape or a T-shape. The cam can operate with a guide element 4003. The guide element can include a slot 40031 and a pin 40032 in which the pin 40032 runs and is constrained to make the intermediary support structure follow a diagonal path. The slot 40031 can be in the intermediary support structure and the pin 40032 may be attached to the support structure or vice versa. In order to increase the stability of the intermediary support structure two guides elements 4003 and 4004 can be used. In FIGS. 23*a* and *b* these are shown as slots 40031 and 40041 and pins 40032 and 40042 arranged at each end of a diagonal across the intermediary support structure.

Examples of linear and rotational actuators can be hand-driven e.g. by a hand-operated knob, a hand-operated screwdriver which fits into a corresponding slot in the actuator or other type of head, a hand-operated drill in a corresponding slot in the actuator, a hexagonal head in a matching hexagonal form in the actuator. The actuators can be over-centered. This list is not exhaustive.

FIG. 24 shows an example of a tiled display in which some display tiles are already installed and, hence, are in the final position (second position), i.e. their operative position. The intermediary support structures shown are mainly rectangular in shape. An opening 3504A is present in in a part 4000 of the intermediary support structure 500-T7 through which an elongate fastening means, e.g. a bolt 3504A1, can be placed in order to fasten the intermediary support structure 500-T7 to the support structure 400. There can be more such openings which can be placed at such parts which can be located at any of the other corners or anywhere else (e.g. in the middle of the bottom side or of the right hand side) along the perimeter of the intermediary support structure as long as they remain accessible once the corresponding display tile is fastened to the intermediary support structure and before an adjacent display tile covers it (as can be seen, for example, with display tile T6 covering the fastening means (elongate member or bolt 3504A1 in opening 3504B) of display tile T2 and display tile T10 covering the fastening means of display tile T6. The intermediary support structures which are completely visible and on which a display tile has not yet been fastened, are in the first position.

FIG. 25 shows the example of FIG. 24 in which the display tile T7 has been placed on its corresponding intermediary support structure 500-T7 and both are in the first position. The intermediary support element 500-T7 has coupling means or fastening means for coupling or fastening to display tile T7, e.g. with a non-permanent joint. The coupling or fastening means can be for example hole 3504 that can mate with protrusion such as a pin on display tile T7. Alternatively or additionally, the coupling or fastening means can be a protrusion such as e.g. a pin that can mate with or enter the hole on the back side of display tile T7.

FIG. 26 shows a further example of an intermediary support structure like the one in FIGS. 24-25. FIG. 26, shows intermediary support structure 500-T7 in the second position thanks to the movement induced by one of the (linear or rotational) actuators described above with respect to FIGS. 14 to FIGS. 23*a-b*. In fact, display tile T7 is already placed/fastened on its intermediary support structure 500-T7 and both behave like one body, but tile T7 is not shown in FIG. 27 in order to clearly show the position of intermediary support structure 500-T7 and the guide elements 4003 and 4004 with their respective slot 40031 and pin 40032 and slot 40041 and pin 40042 for purpose of explanation. The intermediary support structure has been moved in the second position by means of any of the above-described actuators which can act on the intermediary support structure, for example on the intermediary support structure 500-T7, for example on its part 4000. An elongate fastener, which will form a semi-permanent joint or a non-permanent joint, e.g. such as a bolt 3504A1 is introduced in opening 3504A of tile T7 and in a corresponding opening in the support structure 400.

FIG. 27 shows a further example of FIG. 26. In FIG. 27, display tile T7 is shown and is in the second position as it is fastened to the corresponding intermediary support structure 500-T7. Part 4000 of intermediary support structure 500-T7 is visible as it is located outside the perimeter of display tile T7 and, thus, accessible until display tile T11, once in its final position of operation. will cover part 4000 of tile T7. The distance between the loading position of the display tile and the operative position of the display tile becomes equal to the seam between the single display tile and the one or more adjacent display tiles when the single display tile has reached the second position.

In any embodiment shown as from FIG. 14 onwards, once the single display tile is in its second position, the hand-driven linear actuator will preferably be autolocking, thus keeping the single display tile in its second position, or the intermediary support structure can be held in place by fixing it to the support structure with one or more fasteners, such as bolts, wedges or any other suitable fastener.

The fastening means for fastening the intermediary support structure to a support structure can be distributed along one side of the single display tile or two adjacent sides of the single display tile.

In any of the embodiments shown in FIGS. 14 to 29, the linear or rotational actuator can be a single mechanism.

In any of the embodiments shown in FIGS. 14 to 29, the linear or rotational actuator can be configured to be able to induce a movement from the second position to the first position.

In any of the embodiments shown in FIGS. 14 to 29, the linear or rotational actuator can be a hand-driven actuator or can be a motor-driven actuator. The linear or rotational actuator can be self-guided.

In any of the embodiments shown in FIGS. 14 to 29, an intermediary support structure is configured to lie between the single display tile and the support structure.

In any of the embodiments shown in FIGS. 14 to 29, the coupling or fastening means in the intermediary support structure can comprise holes that are configured to mate with protrusions such as pins on the single display tile or vice versa.

In any of the embodiments shown in FIGS. 14 to 29, the intermediary support structure can configured so that the pins and/or holes of the intermediary support structure and the corresponding holes and pins on the back surface of the single display tile are mated and the single display tile and the intermediary support structure behave like a solid body.

In any of the embodiments shown in FIGS. 14 to 29, the intermediary support structure can be configured to be at least partially or temporarily supported by the support structure.

In any of the embodiments shown in FIGS. 14 to 29, the linear or rotational actuator can autolocking so that, when the single display tile is in the second position, the actuator can keep the single display tile in its second position.

In any of the embodiments shown in FIGS. 14 to 29, fastening means for fastening the intermediary support structure to the support structure can be distributed along one side of the single display tile or two adjacent sides of the single display tile.

FIG. 28 shows an alternative of the intermediary support structure shown in FIGS. 24 to 27. The fastening means for fastening the intermediary support structure, e.g. 500-T7, to a support structure can be distributed along one side of the single display tile or two adjacent sides of the single display tile. The latter example is shown in FIG. 28, namely along the bottom side and the right-hand side of the intermediary support structure. The fastening means having an opening 3504A or 3504B or 3504C can each receive elongate fasteners such as bolts. Once a display tile is installed in the second position, i.e. its operative position, the bolt can be fastened so that the intermediary support structure is fastened to the support structure 400, as shown for tiles T3, T4, T9 and T10. The example of the intermediary structure shown in FIG. 28 can be moved from the first position to the second position by means of a linear or rotational actuator 7000 acting on the intermediary support structure via part 4000 of the intermediary support structure, whereby the actuator is located outside the perimeter or footprint of the matching display tile. Also in this example, the actuator remains accessible at any position along the predetermined, e.g. diagonal, path and remains accessible until an adjacent display tile is covering an access (typically from the front of the display tile or tiled display) to the linear or rotational actuator.

FIGS. 29A, 29B, 29C show an alternative guide element in an intermediate support structure compared to the guide element shown in FIGS. 14 to 28. Only a simplified version of an intermediate support structure is shown as FIGS. 29A, 29B, 29C are provided merely for explaining an alternative guide element. This alternative guide element has a V-shaped slot in which a pin can move. When the pin is in the position shown in FIG. 29A, the intermediary support structure will be in the first position, i.e. the loading position of the corresponding display tile. From its position shown in FIG. 29A, the pin can move downwards along the right hand-side leg of the inverted V-shaped guide element till it gets in the position shown in FIG. 29B. In that case, the intermediary support structure (normally with the display tile) will be in the second position, i.e. the operative position of the corresponding display tile. This display tile could be, for example, tile T7 shown in any of the FIGS. 24 to 28 Alternatively, the pin moves from its position shown in FIG. 29A downwards along the left hand-side leg of the inverted V-shaped guide element till it gets in the position shown in FIG. 29C. The embodiment of the guide element (slot and pin) whereby the pin moves from its position in FIG. 29A to its position in FIG. 29B, thus bringing the intermediary support structure (or display tile) from the first position to the second position allows to assemble the tiled display starting from the top left thereof as shown in the various examples provided as FIG. 14 onwards. The embodiment of the guide element (slot and pin) whereby the pin moves from its position in FIG. 29A to its position in FIG. 29C, thus bringing the intermediary support structure (or display tile) from the first position to the second position allows to assemble the tiled display starting from the top right, starting for example from display tile T4. Alternatively, instead of being located in the top left and in the bottom right, the guide elements can also be positioned in the top right and in the bottom left of the intermediary support structure. Alternatively, the guide elements can also be located a bit further away from the respective corners.

A further alternative guide element is a cross-shaped one angled over 45°, i.e. an X-shaped one, wherein the pin can move from the top left leg towards and into the extremity of the bottom right leg, thus moving the intermediary support structure/display tile from the first position to the second position. Alternatively, the pin can move from the top right leg towards and into the extremity of the bottom left leg. The first version allows to assemble the tiled display starting from the top left display tile whereas the second version allows to assemble the tiled display starting from the top right display tile.

When starting to assemble the tiled display starting from the top right display tile, the fastening means for fastening the intermediary support structure to a support structure and which are be distributed along one side of the single display tile or two adjacent sides of the single display tile, will be located along the bottom side and the left-hand side of the intermediary support structure.

The above description also discloses a tiled display configured to be fastened to a support structure and including a plurality of intermediary support structures explained by means of the various embodiments, wherein a plurality of display tiles of the tiled display can be fastened to the support structure by means of intermediary support structures via a plurality of fastening means, whereby a single display tile can be fastened to an associated intermediary support structure of the plurality of intermediary support structures. In the tiled display a plurality of fastening means used to fasten the single display tile to the support structure are either on a single side or edge of the single display tile or are distributed along two abutting sides or edges of the single display tile.

The above description, in particular with respect to the embodiments as from FIG. 14 onwards, also describes a method for installing a display tile in a tiled display, comprising the steps of supporting a single display tile of the tiled display with an intermediary support structure;

moving, by means of a linear or rotational actuator, the single display tile from a first position in a first plane, which the first plane is parallel to the XY-plane of the single display tile, along a predetermined path to a second position in the first plane. The first position is a loading position of the single display tile in the tiled display and the second position is a position in which the single display tile lies when installed in its operative position in the tiled display. When the single display tile is located in the first position, there is a distance between the loading position and the operative position; whereby the distance becomes smaller as the single display tile is moved along the predetermined path towards the second position. The linear or rotational actuator is accessible outside a perimeter or footprint of the single display tile and remains accessible in positions along the predetermined path, and remains accessible until an adjacent display tile is covering an access to the linear or rotational actuator.

In the embodiments explained above with the examples shown in the figures as from FIG. 14 onwards, the intermediary support structure (or the module consisting of display tile and its corresponding intermediary support structure) cannot move freely, but only along a well-defined lateral path. It moves from a first position to a second position along a diagonal via a predefined mechanical guidance. Whereas in the first position the display tile (or module consisting of display tile and its corresponding intermediary support structure) is loaded, the second position is the end position of the display tile (or module consisting of display tile and its corresponding intermediary support structure). This end or final position is the operative position in which the display tile is located. The display tile is then separated by the nominal seam with respect to the adjacent display tiles already installed in their operative position. As explained, to have this movement performed, there is a mechanical tool, an actuator, which can be installed on the support structure to move the intermediary support structure or to move the module consisting of display tile and its corresponding intermediary support structure, i.e. behaving as one body. The actuator is located outside the perimeter of the display tile, and this for any position the display has on the path of movement, i.e. in the first position, the second position or any intermediary position.

The invention claimed is:

1. An intermediary support structure for supporting a single display tile of a tiled display, the tiled display comprising an array of display tiles, and the intermediary support structure comprising:
   a linear or rotational actuator configured to move the single display tile from a first position in a first plane, which the first plane is parallel to the XY-plane of the single display tile, along a predetermined path to a second position in the first plane,
   wherein the intermediary support structure is configured such that the first position is a loading position of the single display tile in the tiled display and the second position is a position in which the single display tile lies when installed in its operative position in the tiled display, wherein, when adjacent tiles of the tiled display are in the second position, the adjacent tiles have a nominal seam between said tiles;
   wherein the intermediary support structure is configured such that when the single display tile is located in the first position, there is a distance between the loading position and the operative position between the single display tile and one or more of the adjacent tiles; and
   wherein the linear or rotational actuator is configured so that the distance becomes smaller as the single display tile is moved along the predetermined path towards the second position, wherein the linear or rotational actuator is configured to be accessible outside a perimeter or footprint of the single display tile and remains accessible in positions along the predetermined path, and remains accessible until an adjacent display tile is covering an access to the linear or rotational actuator, wherein the linear or rotational actuator is covered by another adjacent display tile when the another adjacent display tile is positioned in the second position having the nominal seam between said tiles.

2. The intermediary support structure according to claim 1, wherein the predetermined path is a path at an angle to the X-axis of the XY-plane.

3. The intermediary support structure according to claim 1, wherein the distance between the loading position and the operative position is between adjacent lateral edges facing each other of respectively the single display tile and of the one or more adjacent display tiles.

4. The intermediary support structure according to claim 1, wherein the movement along the predetermined path generated by the linear or rotational actuator is controlled by a linear guide.

5. The intermediary support structure according to claim 1, in which the loading position is the position which the single display tile has during the initial placement thereof in the tiled display.

6. The intermediary support structure according to claim 1, in which the first position is the position in which the distance is larger than the nominal seam between the single display tile and the one or more adjacent display tiles.

7. The intermediary support structure according to claim 6, configured so that the distance becomes equal to the nominal seam between the single display tile and the one or more adjacent display tiles when the single display tile has reached the second position.

8. The intermediary support structure according to claim 1, wherein the intermediary support structure is configured such that the single display tile and the intermediary support structure are a module configured to behave as a single body, whereby a relative position of the single display tile and the intermediary support structure with respect to each other is fixed in any position on the predetermined path.

9. The intermediary support structure according to claim 1, wherein the linear or rotational actuator is configured to be able to induce a movement from the first position to the second position.

10. The intermediary support structure according to claim 1, in which the linear or rotational actuator is a hand-driven actuator.

11. The intermediary support structure according to claim 1, in which the linear or rotational actuator is a motor-driven actuator.

12. The intermediary support structure according to claim 1, in which the linear or rotational actuator is selected from a rack and pinion system, an over centered cam, an articulated lever, over centered articulated lever, a wedged cam.

13. The intermediary support structure according to claim 1, which is configured to lie between the single display tile and a support structure.

14. The intermediary support structure according to claim 1, further comprising coupling means or fastening means configured for coupling or fastening the intermediary support structure to a single display tile.

15. The intermediary support structure according to claim 14, wherein the coupling or fastening means comprises holes that are configured to mate with protrusions such as pins on the single display tile or vice versa.

16. The intermediary support structure according to claim 15, configured so that the pins and/or holes of the intermediary support structure and the corresponding holes and pins on a back surface of the single display tile are mated and the single display tile and the intermediary support structure behave like a solid body.

17. The intermediary support structure according to claim 1, configured to be at least partially or temporarily supported by a support structure.

18. The intermediary support structure according to claim 1, wherein the linear or rotational actuator is self-guided.

19. The intermediary support structure according to claim 1, wherein the single display tile is in the second position and the linear or rotational actuator is autolocking to keep the single display tile in its second position.

20. The intermediary support structure according to claim 1, wherein fastening means for fastening the intermediary support structure to a support structure are distributed along one side of the single display tile or two adjacent sides of the single display tile.

21. A tiled display configured to be fastened to a support structure and including a plurality of intermediary support structures according to claim 1, wherein an array of display tiles of the tiled display is fastened to the support structure by means of the intermediary support structures by means of a plurality of fastening means, whereby a single display tile is fastened to an associated intermediary support structure of the plurality of intermediary support structures.

22. The tiled display according to claim 21, wherein a plurality of fastening means used to fasten the single display tile to the support structure are either on a single side or edge of the single display tile or are distributed along two abutting sides or edges of the single display tile.

23. A method for installing a display tile in a tiled display, the tiled display comprising an array of display tiles, comprising the steps of:

supporting a single display tile of the tiled display with an intermediary support structure; moving, by means of a linear or rotational actuator, the single display tile from a first position in a first plane, which the first plane is parallel to the XY-plane of the single display tile, along a predetermined path to a second position in the first plane, wherein the first position is a loading position of the single display tile in the tiled display and the second position is a position in which the single display tile lies when installed in its operative position in the tiled display, wherein, when adjacent tiles of the tiled display are in the second position, the adjacent tiles have a nominal seam between said tiles;

wherein the intermediary support structure is configured such that when the single display tile is located in the first position, there is a distance between the loading position and the operative position between the single display tile and one or more of the adjacent tiles;

wherein the intermediary support structure is configured such that the distance becomes smaller as the single display tile is moved along the predetermined path towards the second position, wherein the linear or rotational actuator is configured to be accessible outside a perimeter or footprint of the single display tile and remains accessible in positions along the predetermined path, and remains accessible until an adjacent display tile is covering an access to the linear or rotational actuator, wherein the linear or rotational actuator is covered by the adjacent display tile when the adjacent display tile is positioned in the second position having the nominal seam between said tiles.

* * * * *